United States Patent [19]
Botez et al.

[11] Patent Number: 5,889,805
[45] Date of Patent: Mar. 30, 1999

[54] LOW-THRESHOLD HIGH-EFFICIENCY LASER DIODES WITH ALUMINUM-FREE ACTIVE REGION

[75] Inventors: Dan Botez, Madison; Luke J. Mawst, Sun Prairie, both of Wis.

[73] Assignee: Coherent, Inc., Santa Clara, Calif.

[21] Appl. No.: 741,632

[22] Filed: Nov. 1, 1996

[51] Int. Cl.$^6$ ........................................ H01S 3/19
[52] U.S. Cl. ................................ 372/45; 372/46
[58] Field of Search ........................ 372/45, 46

[56] References Cited

U.S. PATENT DOCUMENTS

| | | | |
|---|---|---|---|
| 4,852,116 | 7/1989 | Takguchi et al. | 372/45 |
| 4,959,839 | 9/1990 | Yamamoto | 372/46 |
| 5,003,548 | 3/1991 | Bour et al. | 372/44 |
| 5,124,995 | 6/1992 | Yokotsuka et al. | 372/45 |
| 5,218,613 | 6/1993 | Serreze | 372/45 |
| 5,222,090 | 6/1993 | Serreze | 372/45 |
| 5,268,328 | 12/1993 | Mori et al. | 372/45 |
| 5,289,484 | 2/1994 | Hayakawa | 372/45 |
| 5,305,341 | 4/1994 | Nishikawa | 372/45 |
| 5,381,024 | 1/1995 | Valster | 372/45 |
| 5,389,396 | 2/1995 | Razeghi | 427/58 |
| 5,446,753 | 8/1995 | Yoshida | 372/45 |
| 5,479,427 | 12/1995 | Yoshida et al. | 372/45 |
| 5,557,627 | 9/1996 | Schneider, Jr. et al. | 372/45 |

OTHER PUBLICATIONS

"High–power InGaAsP/GaAs 0.8 micrometer laser diodes and peculiarities of operational characteristics", Diaz et al., App. Phys. Lett. 65 (8) pp. 1004–1005, Aug. 1994.

"Optimized structure for InGaAsP/GaAs 808nm high power lasers", Yi et al., App. Phys. Lett., vol. 66 (24) pp. 3521–3523 (Jun. 1995).

"High–Power 0.8 micrometer InGaAsP–GaAs SCH SQW Lasers", Garbuzov et al., IEEE Journal of Quantum Electronics, vol. 27, No. 6 pp. 1531–1536 (Jun. 1991).

"High Power 875 nm Al–Free Laser Diodes", Plano et al. IEEE Photonics technology Letters, vol. 6, No. 4, pp. 465–467 (1994) (Apr.).

"Highly Reliable Operation of High–Power InGaAsP/InGaP/AlGaAs 0.8 micrometer Separate Confinement Heterostructure Lasers", Fukunaga et al., Japan J. Appl. Phys., vol. 34, Part 2, No 9B, L1175–L1177 (Sep. 1995).

"Phase Diagrams of InGaAsP, InGaAs, and InP Lattice–Matched to (100)InP", Kuphal, Journal of Crystal Growth, 67, pp. 441–457, (1984) (No Month Available.

*Primary Examiner*—Rodney Bovernick
*Assistant Examiner*—Yisun Song
*Attorney, Agent, or Firm*—Limbach & Limbach L.L.P.

[57] ABSTRACT

Semiconductor diode lasers include an aluminum free active region including at least one active layer having a general composition $In_{(1-x)}Ga_xAs_yP_{(1-y)}$ where $0 \leq y \leq 1$; two confinement layers bounding the active region and having a general composition $In_{(1-x)}(Ga_{(1-z)}Al_z)_xP$ wherein aluminum content z may be zero; and a lower cladding layer, and at least one upper cladding layer adjacent the confinement layers. The cladding layers have the same general composition as the adjacent confinement layer, but always have a finite aluminum content. The aluminum content of the cladding layers is selected such that the cladding layers have a energy bandgap greater than the energy bandgap of the confinement layers.

20 Claims, 11 Drawing Sheets

LOW-THRESHOLD HIGH-EFFICIENCY LASER DIODES WITH ALUMINUM-FREE ACTIVE REGION

TECHNICAL FIELD OF THE INVENTION

The present invention relates in general to semiconductor diode lasers. It relates in particular to a gain guided separate confinement heterostructure diode laser having an active layer formed from an aluminum-free semiconductor compound, and cladding layers formed from semiconductor compounds including aluminum.

DISCUSSION OF BACKGROUND ART

High power semiconductor diode laser devices emitting at a wavelength ($\lambda_g$) in a range between about 0.80 micrometers ($\mu$m) and 0.87 $\mu$m are of interest in certain applications, such as pump sources for Nd:YAG lasers. Conventionally, for $\lambda_g \leq 0.85$ $\mu$m, such lasers use aluminum gallium arsenide (AlGaAs) as an active layer. Such lasers, however, are known to suffer from short lifetimes and limited output power compared with the aluminum-free compound gallium arsenide( GaAs).

Quaternary alloys in the system indium gallium arsenide phosphide (InGaAsP), lattice matched to GaAs, offer an attractive alternative to the AlGaAs/GaAs system. They offer a potential of greater reliability, due to a resistance to formation of so-called dark-line defects, and due to a larger mirror-facet damage limit, since InGaAsP has significantly lower surface recombination velocity than AlGaAs. They also offer a potential for growing reliable diode lasers on silicon substrates rather than on gallium arsenide substrates, which are conventionally used. Properties and methods of growth of such aluminum-free lasers are discussed in detail in U.S. Pat. No. 5,389,396 to Razeghi, and in a paper "High-Power 0.8 $\mu$m InGaAsP-GaAs SCHSQW Lasers", Garbuzov, D. Z., et al., *IEEE Journal of Quantum Electronics*, Vol 27, No. 6, June 1991, pp. 1531–1535.

A particular problem with lasers formed from the InGaAsP/GaAs material system is that only small conduction band discontinuities are possible between adjacent layers. This causes the laser to suffer massive carrier leakage from the active region. Because of this, such lasers have a relatively high threshold-current density for lasing, low internal efficiency ($\eta_i$), and a low threshold-current characteristic temperature ($T_0$). A low $T_0$ corresponds to a more rapid increase in threshold-current with increasing heatsink temperature.

One attempt to solve the problem of carrier leakage in lasers having an active region formed from the InGaAsP/GaAs material system has been made by forming cladding layers of an aluminum-containing material (AlGaAs) and forming only the active layer and bounding waveguide or confinement layers from compounds in the InGaAsP/GaAs material system. This work is described in detail in a paper "Highly Reliable Operation of High-Power InGaAsP/InGaP/AlGaAs 0.8 $\mu$m Separate Confinement Heterostructure Lasers", Fukunaga, T. et al., *Japan Journal of Applied Physics*, Vol. 34, Part 2, No 9B, pp. L1175–L1177, (September 1995). Positive results disclosed in this paper were that inclusion of aluminum containing cladding layers does not appear to adversely affect reliability of the lasers, and that a higher $T_0$ was obtained than had been obtained for aluminum free lasers. Unfortunately, the lasers appeared had a relatively high $J_{th}$.

There is a need for semiconductor diode lasers which have the advantages of lasers having an aluminum-free active layer, but which have high internal efficiency, a high $T_0$, and a low $J_{th}$. Notwithstanding any improvements already made in increasing efficiency and $T_0$, further improvements therein are needed to improve reliability of such lasers and to expand their range of applications.

SUMMARY OF THE INVENTION

In lasers in accordance with the present invention, the above-discussed use of aluminum-containing compounds outside of the active region has been further exploited. Semiconductor diode lasers have been grown in which active and confinement or waveguide layers are aluminum-free, and cladding layers include aluminum. Lasers have also been grown in which confinement layers as well as cladding layers include aluminum. The above-discussed positive results of Fukunaga et al. have been improved on. Lasers having $J_{th}$ as low as, or lower than, any previously reported values have been grown. Maximum CW powers for 100 $\mu$m-wide stripe devices are higher than any previously reported values. Furthermore, the emitted power density at catastrophic optical mirror damage has been determined to be at least twice that of AlGaAs-active-region devices. This provides for reliable operation at twice the power level of AlGaAs-active-region devices of the same geometry.

In one embodiment of the present invention, a laser diode structure formed on an n-type substrate comprises an undoped active region including at least one layer of $In_{(1-x)}Ga_xAs_yP_{(1-y)}$, where $0 \leq y \leq 1$, $0 < x < 1$, and where x and y are selected such that the emission wavelength $\lambda_g$ of the laser diode structure is between about 0.80 $\mu$m and 0.87 $\mu$m. A first confinement layer is adjacent the active region on the substrate side thereof, and a second confinement layer is adjacent the active region on the side thereof opposite the substrate. Each of the confinement layers has a composition $In_{(1-x)}(Ga_{(1-z)}Al_z)_xP$ where $0 < x < 1$, and $0 \leq z < 1.0$. First and second cladding layers are adjacent the first and second confinement layers respectively. The first and second cladding layers have a composition $In_{(1-q)}(Ga_{(1-w)}Al_w)_qP$, where $0 < q < 1$, $0 \leq w < 1.0$, and the product of q and w is preferably no greater than about 0.30. The first and second cladding layers are respectively n and p doped. Values of q, w, x and z for the confinement and cladding layers are selected such that the cladding layers have a higher energy bandgap than the energy bandgap of the confinement layers.

In another embodiment of the present invention, a diode laser structure includes multiple cladding layers covering the second confinement layer. The multiple cladding layers include a p-doped, third cladding layer adjacent the second cladding layer and having a composition $Al_xGa_{(1-x)}As$, and a p-doped, fourth cladding layer adjacent the third cladding layer and having a composition $In_{(1-r)}(Ga_{(1-m)}Al_m)_rP$ where r, m are selected such that the fourth cladding layer has an energy bandgap less than or equal to the energy bandgap of the second cladding layer. The third cladding layer has a conduction band energy offset, with respect to the second confinement layer, higher than that of the second cladding layer. This embodiment of the present invention provides for improved carrier confinement compared with embodiments thereof having only the second cladding layer.

In lasers having above discussed multiple cladding layers, it has been found advantageous to include a relatively thin transition layer between the second and third cladding layers and between the third and fourth cladding layers. These transition layers serve to mitigate potential adverse effects when two significantly dissimilar materials, for example, InGaAlP and AlGaAs, are used for adjacent cladding layers.

They are characterized in that they are significantly thinner than any of the cladding layers and preferably have a thickness less than about 100 Ångstrom units (Å.U.). A preferred material for these transition layers is $Al_sGa_{(1-s)}As$ where s is preferably between 0.0 and about 0.1.

In yet another embodiment of the present invention, the active region including one active layer of $In_{(1-x)}Ga_xAs_yP_{(1-y)}$ has first and second bounding layers having a composition $In_{(1-x)}Ga_xP$ on opposite sides thereof. The bounding layers each have a thickness between about 50 Å.U. and 250 Å.U.

A first confinement layer is adjacent the first bounding layer and a second confinement layer is adjacent the second bounding layer. Each of the confinement layers has a composition $In_{(1-x)}(Ga_{(1-z)}Al_z)_xP$ where $0<x<1$, and $0<z<1.0$. First and second cladding layers are adjacent the first and second confinement layers respectively. The first and second cladding layers have a composition $In_{(1-q)}(Ga_{(1-w)}Al_w)_qP$, where $0<q<1$, and $0\leq w<1.0$. The first and second cladding layers are respectively n and p doped. Values of q,w,x and z for the confinement and cladding layers are selected such that the cladding layers have a higher energy bandgap than the confinement layer. The bounding layers have a higher energy bandgap than the active layer but a lower energy bandgap than the confinement layers.

BRIEF DESCRIPTION OF THE DRAWINGS

The accompanying drawings, which are incorporated in and constitute a part of the specification, schematically illustrate preferred embodiments of the invention and, together with the general description given above and the detailed description of preferred embodiments given below, serve to explain the principles of the invention.

DETAILED DESCRIPTION OF THE INVENTION

Figure 1:
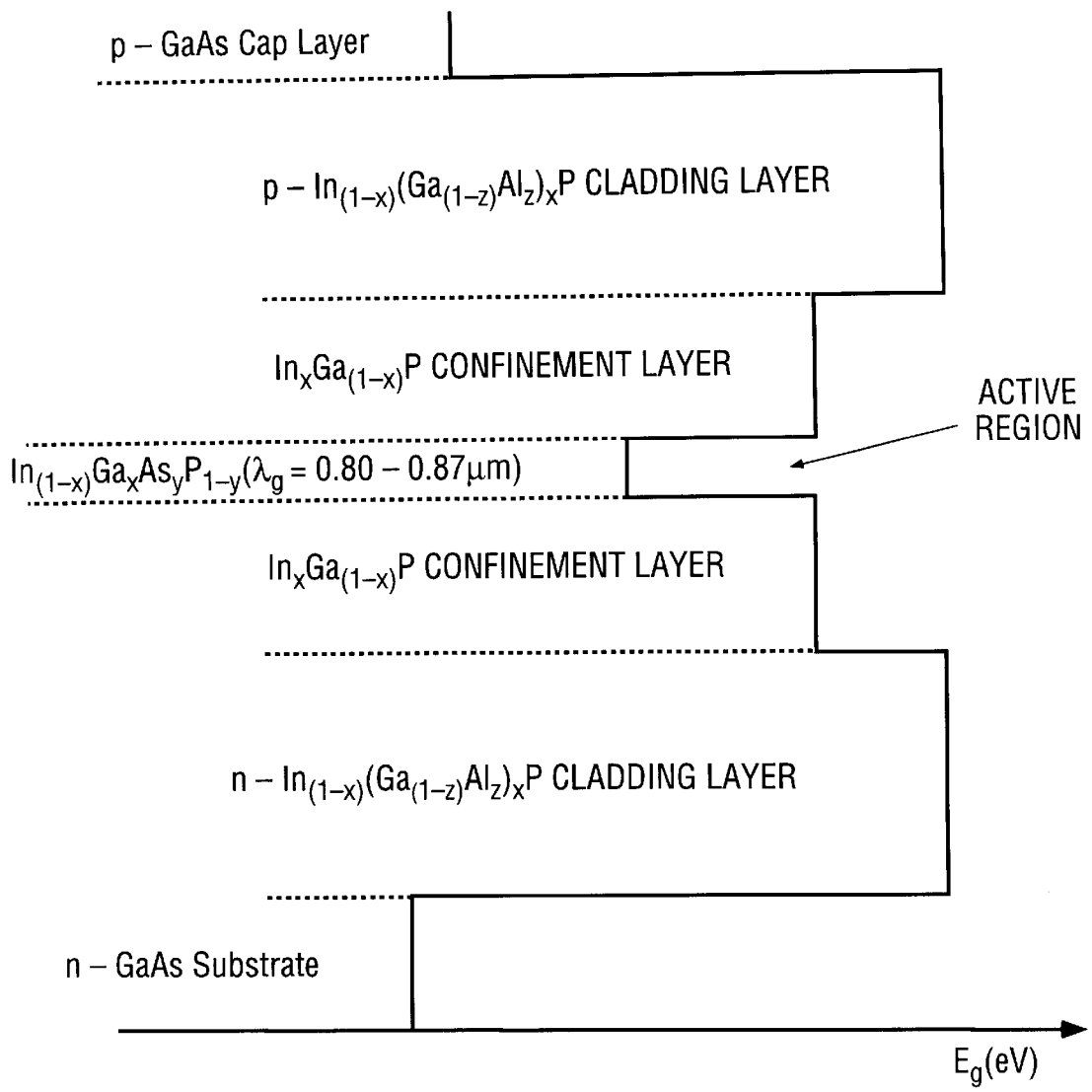
FIG. 1 is a diagram schematically illustrating a first preferred embodiment of a semiconductor diode laser structure in accordance with the present invention having an InGaAsP active layer having a composition selected to provide light emission at a wavelength $\lambda_g$ between about 0.80 μm and 0.87 μm, and two InGaAlP cladding layers.

In order to appreciate the following description of structure and performance of semiconductor diode lasers in accordance with the present invention, it is useful to consider certain important characteristics of semiconductor lasers, one or more of which are used herein to compare performances of embodiments of the present invention with each other, as well as with prior art semiconductor diode lasers. A discussion of these characteristics is set forth below.

The lasers discussed herein are all examples of, gain guided, separate confinement heterostructure (SCH), diode lasers. These are characterized as having an active region including at least one active or quantum-well layer. The active layer (or active region) is bounded on each side thereof by a waveguide or optical confinement (hereinafter, simply confinement) layer. These confinement layers each are bounded by one or more cladding layers. All layers are have essentially homogeneous properties. The entire system of layers is deposited on a semiconductor substrate.

As the active layer or region can be thought of as being the operational "center" of such a laser, a convention is adopted herein wherein layers on the substrate side of the active region are referred to as lower layers, and those layers on the opposite side of the substrate are referred to as upper layers.

In lasers of a construction similar to that discussed above, the active layer or region and confinement layers form a laser cavity which is characterized by a cavity length (L) a cavity width, and a cavity height. The latter being essentially the total thickness of the active and confinement layers and any intervening layers. Each end of the cavity is described as a facet. Output light is emitted from the facets.

An "aluminum-free" diode laser as discussed herein is a diode laser wherein either the active layer is aluminum free or wherein the active and confinement layers are aluminum-free. Such a laser, however, may have aluminum containing material in one or more other layers particularly cladding layers. A diode laser of the type wherein no layer contains aluminum, such as lasers described in the above-discussed Razeghi patent, is referred to herein, specifically, as a "completely aluminum-free" diode laser.

Lasers in accordance with the present invention are characterized in particular by a threshold-current density $J_{th}$ which is the minimum areal current density which must be passed through the device to cause onset of lasing action. The threshold-current density increases with operating temperature of the laser and may be defined by an equation:

$$J_{th}(T_f) = J_{th}(T_i) \exp\left(\frac{T_f - T_i}{T_0}\right) \quad (1)$$

where $T_f$ and $T_i$ are two different temperatures (here, $T_f > T_i$) at which $J_{th}$ is measured. $T_0$ is the threshold-current characteristic temperature. It is essentially constant over a certain range of temperatures. Increasing $T_0$ decreases temperature dependence of $J_{th}$.

Three values of efficiency are typically used to characterize a semiconductor diode laser. A first of these, the internal quantum efficiency, ususally designated $\eta_i$, is the efficiency of converting injected carriers to light photons at any location in the laser cavity (active layer). An external, differential, quantum efficiency ($\eta_D$) is the efficiency of converting injected carriers to laser light output, at both facets. This differential quantum efficiency is a function of $\eta_i$, the length of the cavity (L), and the internal cavity loss coefficient ($\alpha_i$) which takes into account losses due to free-carrier absorption and scattering. The lower $\alpha_i$ the higher $\eta_D$ for a given L. The relationship of $\eta_D$ to L is not straightforward, and is most conveniently determined experimentally. Another measure of efficiency is usually termed the "wallplug efficiency", referred to herein as $\eta_p$, and represents the overall electrical to optical power conversion efficiency. This measure thus includes that electrical power which is used to overcome electrical resistance of materials of the laser and interfaces between layers.

It should be noted that $\eta_D$ is temperature sensitive and may be defined by an equation:

$$\eta_D(T_f) = \eta_D(T_i) \exp-\left(\frac{T_f - T_i}{T_1}\right) \quad (2)$$

where $T_i$ and $T_f$ are two different temperatures at which $T_1$ is measured. $T_1$ is essentially constant over a certain temperature range. The higher the value of $T_1$, the less sensitive is $\eta_D$ to temperature.

Examples of laser structures in accordance with the present invention, described below, were developed with the goal of reaching target values for the above-discussed characteristics as follows. $T_0 \approx 150K$; $T_1 750K$; and $\eta_D = 1.0$ Watts/Ampere (W/A) based on $\eta_i = 90\%$, and $\alpha_i = 4$ $cm^{-1}$.

All structures described hereinbelow were grown by low pressure (about 50 millibar) metalorganic vapor phase epitaxy (MOVPE). MOVPE has now become essentially the industry standard method for growing semiconductor lasers of the type discussed herein, accordingly those familiar with the art to which the present invention pertains will be familiar with the apparatus and techniques used to carry out the method. Because of this, a description of MOVPE apparatus and its operation are not presented herein. Certain important aspects of layer growth, however, are set forth below.

Layers were grown at a temperature of 700° C., except for a zinc (Zn) doped (p-doped) $p^+$-GaAs contact layer on top of the laser structures. This layer was grown at a temperature of 650° C. to increase Zn incorporation therein. The layers of the structures were grown on exactly oriented (100), $n^+$-GaAs (n-doped) substrates. Source materials for layer growth were trimethylgallium, trimethylindium, arsine, phosphine, and trimethylaluminum. Diethyl zinc and silane were used for respectively p and n type dopants for those layers which are doped.

Regarding evaluation of lasers, laser structures were evaluated by characterizing 100 $\mu$m-wide stripe lasers formed by chemically etching grooves through the $p^+$-GaAs contact layer and defining an 80 $\mu$m-wide metal contact opening using a silicon dioxide ($SiO_2$) mask. Lasers of various (cavity) lengths L were tested under pulsed-current operation (2.0 Kilohertz with a 5.0 microsecond pulse width) to determine $J_{th}$; $\eta_i$; $\alpha_i$; and $T_0$. All other characteristics were measured under CW operating conditions. For these CW measurements lasers were mounted junction-side down, i.e., substrate-side up, on a diamond or copper heat-sink operated with a thermoelectric cooler.

In order to provide reference data for comparing diode lasers in accordance with the present invention with completely aluminum-free diode lasers, a laser structure was grown in accordance with teachings of the above referenced Razeghi patent. This diode laser included an $In_{(1-x)}Ga_xAs_yP_{(1-y)}$ active layer or quantum-well having a thickness of 100 Å.U. and x and y being such as to provide an emission wavelength $\lambda_g = 0.815$ $\mu$m. The active layer was bounded by confinement layers of $In_{(1-x)}Ga_xAs_yP_{(1-y)}$, with x and y corresponding to an emission wavelength $\lambda_g = 0.73$ $\mu$m, and having a thickness of 1000 Å.U. each. Bounding each of the confinement layers was a cladding layer of $In_{0.49}Ga_{0.51}P$. A laser having this structure and a cavity length of 1.0 mm had $J_{th} = 340$ Amperes per square centimeter ($A/cm^2$) which was about 25% lower than values reported in a paper "High-power InGaAsP/GaAs 0.8 $\mu$m laser diodes and peculiarities of operational characteristics" Diaz et al., *Appl. Phys. Lett.*, 65, (8) pp 1004–5, August 1994. This laser, however, had $T_0 = 75K$ which is well below the target for $T_0$ and indicative of the massive carrier losses which are characteristic of completely aluminum-free lasers.

Continuing now with reference to FIG. 1, a first preferred embodiment of a semiconductor diode laser structure in accordance with the present invention is described. The structure is illustrated in FIG. 1 in the form of a conduction band energy diagram, as is common in the art to which the present invention pertains. Here, conduction band energy $E_g$, which has the dimension of electron volts (eV), is plotted against thickness of the structure. Discontinuities in the conduction band energy plot occur at interfaces between adjacent layers, which are indicated in FIG. 1 by dashed lines. Distances in both the conduction band energy and thickness axes in FIG. 1 and other similar diagrams herein are generally relative only and are not to scale.

It should be noted here that, throughout this discussion and the appended claims, different variable-designating letters and corresponding alphanumeric combinations thereof, for example x/(1–x) and p/(1–p) and the like, which are used to indicate element proportions in alloy compositions, may be used to show a general composition of the same alloy system. This is done, occasionally, for emphasis, in instances where two or more layers in a structure have the same general composition, but different element ratios. Such instances, however, are also explicitly specified or are implicitly specified by other relevant parameters, such as a different energy bandgap.

The active or quantum-well layer, in a laser structure in accordance with the present invention having an active region consisting of only one active layer, preferably has a thickness between about 100 Å.U. And 300 Å.U. And more preferably between about 100 Å.U. And 200 Å.U. A thickness of 150 Å. U. is selected for all single-active-layer examples described below. The active layer composition is a composition selected from the general composition $In_{(1-x)}Ga_xAs_yP_{(1-y)}$, where $0<x<1$, and $0 \leq y \leq 1$, and x and y are selected to provide an emission wavelength $\lambda_g$ between about 0.80 μm and 0.87 μm. Those skilled in the art to which the present invention pertains will recognize that the emission wavelength of a SCH laser is dependent primarily on the composition of the active layer and to a lesser extent to the degree to which the layer is strained. This strain is in turn determined primarily by the degree of lattice mismatch of the layer with respect to the GaAs substrate. The emission wavelength is also temperature dependent.

Typically, as was the case in all practical examples of laser structures in accordance present invention described below, composition is established by "calibrating" deposition parameters of the material of the layer in about the composition range expected to provide a desired emission wavelength. The calibration is performed and adjusted according to measurements including emission wavelength of test devices; measurement of the photoluminescence spectrum of test devices; and "rocking curves" obtained from double X-Ray diffraction which are used to establish lattice mismatch. For lasers in accordance with the present invention, relative lattice mismatch ($\Delta a/a$) of the active layer is preferably less than $\pm 1 \times 10^{-3}$.

The dependence of emission wavelength with composition is discussed in detail in the above-referenced Razeghi patent, the complete disclosure of which is hereby incorporated by reference. Composition of active layers in examples of lasers in accordance with the present invention described below was estimated from data disclosed in a paper "Phase Diagrams of InGaAsP InGaAs, and InP lattice matched to (100) InP", E. Kuphal, *J. Crystal Growth*, Vol 67, pp 441–457 (1994). These estimated compositions are $In_{0.04}Ga_{0.96}As_{0.89}P_{0.11}$ for devices emitting at $\lambda_g=0.83$ μm, and $In_{0.08}Ga_{0.92}As_{0.01}P_{0.19}$ for devices emitting at $\lambda_g=0.81$ μm.

Upper and lower confinement layers, on either side of the active layer each have a composition $In_xGa_{(1-x)}P$, where x is preferably between about 0.49. Preferably the thickness of the confinement layers is between about 0.2 μm and 0.5 μm.

Upper and lower cladding layers adjacent each of the confinement layers have a general composition $In_{(1-x)}(Ga_{(1-z)}Al_z)_xP$ (where $0<x<1$, and $0 \leq z<1.0$). Preferably, however, aluminum proportion, defined herein as the product of x and z in $In_{(1-x)}(Ga_{(1-z)}Al_z)_xP$, should be between about 0.20 and 0.35 and preferably between about 0.22 and 0.30. Thickness of each cladding layer is preferably between about 1.0 μm and 1.5 μm. Alloys in the InGaAlP composition system are known to generally increase in energy bandgap with increasing Al content, i.e. energy bandgap is determined by selection of values for x and z. The lower cladding layer is n-doped and the upper cladding layer is p-doped. InGaAlP was selected as being a cladding-layer material more compatible with the InGaP material of the confinement layers than AlGaAs compositions ($Al_{0.7}Ga_{0.3}As$) investigated in the above-discussed Fukunaga et al. paper.

InGaAlP with an aluminum proportion less than 0.30 has a direct energy bandgap, and, because of this, has a much lower electrical resistance than these AlGaAs compositions. At higher aluminum proportions than 0.30 electrical resistance increases significantly. Higher electrical resistance leads to increased operating temperature and increased $J_{th}$. Because of this it is most preferable that the aluminum proportion of the first and second upper cladding layers be no greater than about 0.30.

One example of a laser having the structure of FIG. 1 had an estimated confinement layer composition of $In_{0.49}Ga_{0.51}P$, and a cladding layer composition of $In_{0.5}(Ga_{0.5}Al_{0.5})_{0.5}P$. Thickness of the confinement and cladding layers was respectively 0.4 μm and 1.25 μm. Active layer thickness was 150 Å.U. The laser had a 1 mm-long cavity, a 100 μm-wide stripe, uncoated facets, and emitted at $\lambda=0.83$ μm. The maximum output power (both facets) was 4.6 Watts (W). Other characteristics included $\eta_D=77\%$ from $\alpha_i=2$ cm$^{-1}$ and $\eta_i=84\%$. Wallplug efficiency $\eta_p$ reached a maximum value of 45% at an output power of 1.23 W. The values for maximum output power and $\eta_p$ are believed to be higher than have been reported for any aluminum-free diode laser of similar cavity dimensions emitting in the 0.80 μm to 0.87 μm range.

The high $\eta_p$ value for the laser of FIG. 1 is due to a low threshold-current density $J_{th}$, high $\eta_D$, low temperature sensitivity of $J_{th}$ and $\eta_D$, and a relatively low series resistance of about 0.2 Ohms ($\Omega$). Specifically, Jth was about 220 A/cm$^2$, and $T_0$ and $T_1$ were respectively 120° K. and 1200° K. over a temperature range from 20° C. to 60° C. While $T_0$ falls short of the above discussed target value it represents a significant improvement over the 75° K. value obtained in the above-discussed completely aluminum-free laser diode.

The relatively high value of $T_0$ and low $J_{th}$ for a laser having the structure of FIG. 1 compared with a completely aluminum-free laser indicates its effectiveness in reducing carrier losses. This effectiveness is achieved with almost no penalty in increased electrical series resistance, as $In_{0.5}(Ga_{0.5}Al_{0.5})_{0.5}P$ has a direct bandgap, as discussed above, and, consequently, high carrier mobility.

Figure 2:
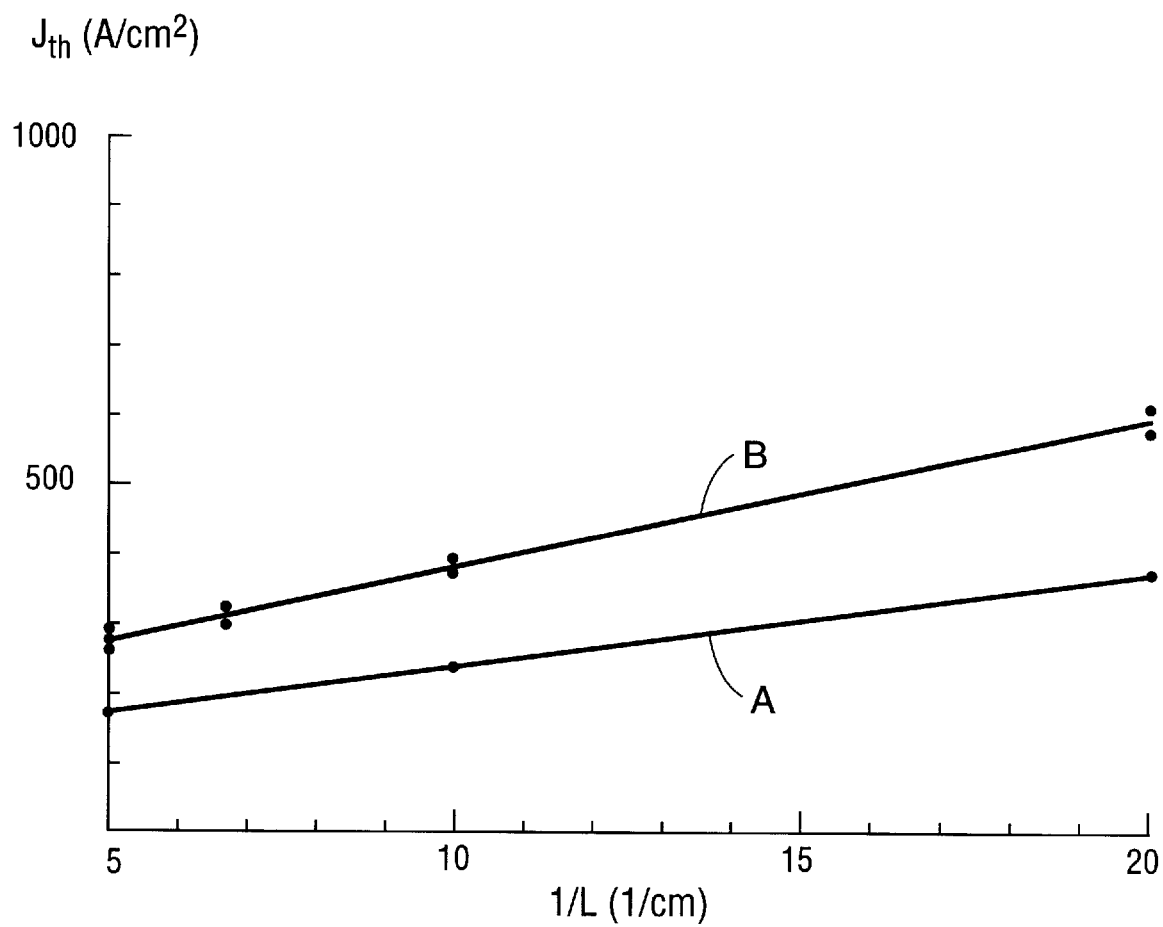
FIG. 2 is a graph schematically illustrating threshold current as a function of cavity length for a laser having the structure of FIG. 1 and for a completely aluminum-free reference laser having a prior-art structure.

Effectiveness in limiting carrier leakage is further evidenced by a very low increase in threshold with decreasing cavity length. This is illustrated in FIG. 2, wherein curve A illustrates measured $J_{th}$ as a function of inverse cavity length. Even for a cavity as short as 0.5 mm, Jth is only 355 A/cm2. Curve B shows the performance for the above-discussed, prior-art, completely aluminum-free InGasAsP/InGaP "reference" laser. It is believed that these $J_{th}$ values of curve A are lower, and the increase in values with inverse cavity length is lower than any reported for prior art aluminum-free diode lasers emitting in the 0.80 μm to 0.87 μm range.

Figure 3:
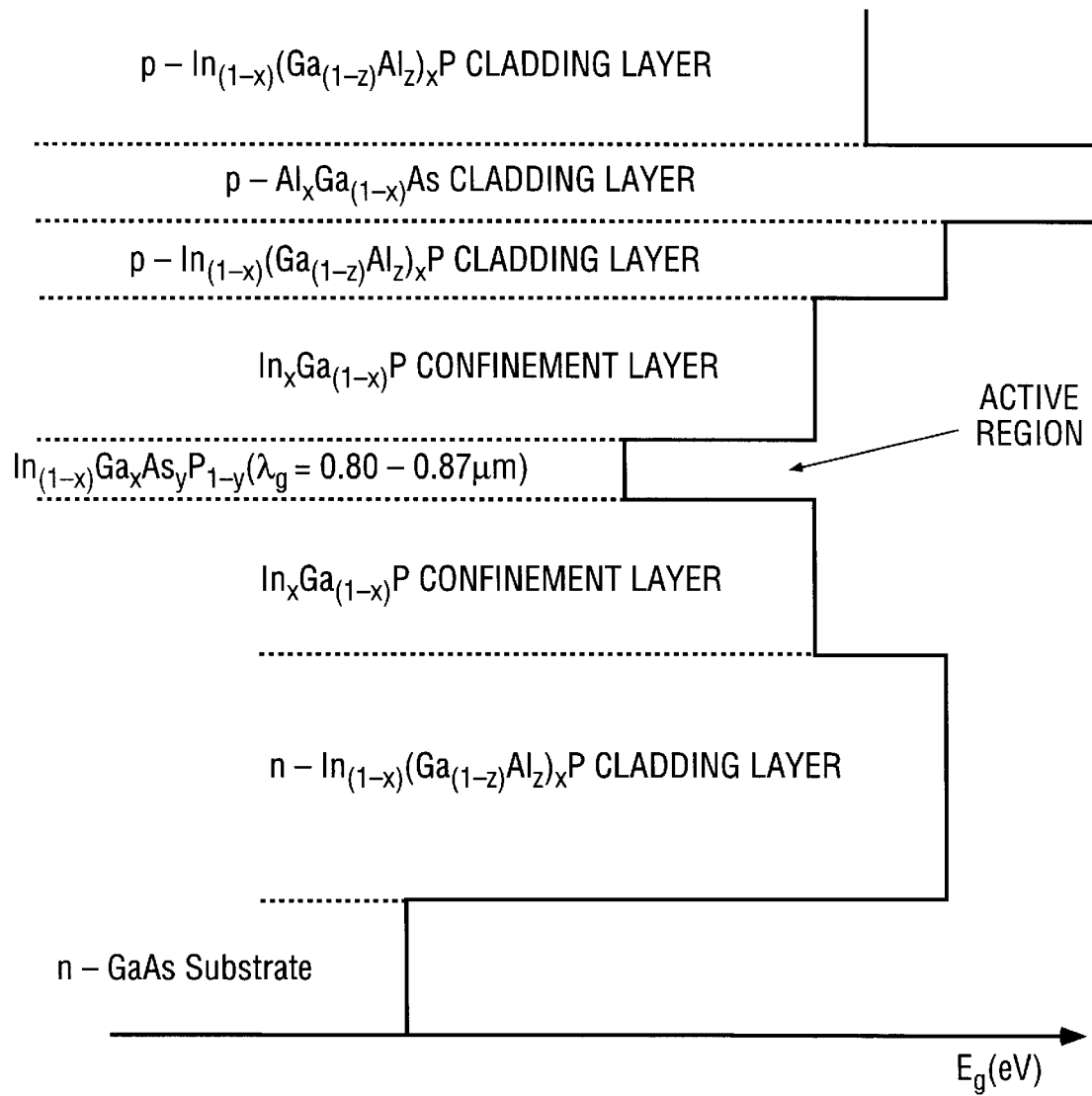
FIG. 3 is a diagram schematically illustrating a second preferred embodiment of a semiconductor diode laser structure in accordance with the present invention having an InGaAsP active layer having a composition selected to provide light emission at a wavelength $\lambda_g$ between about 0.80 μm and 0.87 μm, and one n-doped cladding layer and two p-doped InGaAlP cladding layers having a p-doped AlGaAs cladding layer therebetween.

Continuing now with reference to FIG. 3, a more complex cladding layer arrangement for the upper confinement layer, for providing increased carrier retention is next described. Preferred composition and thickness ranges for the active and confinement layers of the laser of FIG. 3 is the same as for the laser of FIG. 1. Preferred composition and thickness ranges for the a lower n-doped $In_{(1-x)}(Ga_{(1-z)}Al_z)_xP$) cladding layer are the same as for the laser structure of FIG. 1. A first, p-doped, $In_{(1-x)}(Ga_{(1-z)}Al_z)_xP$), upper cladding layer adjacent the confinement layer has the same preferred composition range as the upper cladding layer of the laser of FIG. 1. Adjacent the first upper cladding layer is a second upper cladding layer having a composition of the general alloy system $Al_xGa_{(1-x)}As$ (where $0<x \leq 1$). The composition of the second upper cladding layer is selected to provide material having a conduction band energy offset, with respect to the upper confinement layer, greater than that of the first upper cladding layer. However, as this material has a high electrical resistivity, thickness of this second upper cladding layer is preferably kept between about 0.1 μm and 0.3 μm. Aluminum proportion (x in $Al_xGa_{(1-x)}As$) in the second upper cladding layer is preferably selected to be between about 0.70 and 1.00.

The thickness of the first upper cladding layer is preferably selected to be between about 0.1 μm and 0.2 μm, which allows the second cladding layer to be relatively close to the laser cavity, thereby increasing its effectiveness in retaining carriers in the cavity.

Adjacent the second upper cladding layer is a third, p-doped, $In_{(1-x)}(Ga_{(1-z)}Al_z)_xP$), upper cladding layer. Preferably the aluminum proportion in the third upper cladding layer is between about 0.05 and 0.30. The thickness of the third upper cladding layer is preferably between about 0.2 μm and 1.5 μm, and more preferably between about 0.2 μm and 1.0 μm. The values of x and z (aluminum proportions) for the first and third upper cladding layers are preferably selected such that the third upper cladding layer has an energy bandgap less than or equal to the energy bandgap of the first upper cladding layer.

Lasers grown exactly in accordance with the structure illustrated in FIG. 3 can produce inconsistent results. It was determined that this is due to a problem resulting from a dissimilarity between the AlGaAs material of the second upper cladding layer and the InGaAlP compositions of adjacent cladding layers. This problem can be avoided by providing what may be described as a "transition layer" between the second and third cladding layers, or between the first and second cladding layers. Preferably, transition layers are provided between all three layers. These transition layers are very thin relative to even the thinnest of the cladding layers (preferably between about 30 Å.U. and 150 Å.U) and have a general composition $Al_xGa_{(1-x)}As$, wherein the Al proportion x is preferably between 0.0 and about 0.2, and more preferably between about 0.0 and 0.1. The transition layers are preferably p-doped, and preferably have an energy bandgap between the energy band gap than the active layer and the energy bandgap of the n—GaAs substrate. Important here is that the aluminum proportion is sufficiently low, for a selected transition layer thickness, that light absorption in these regions is avoided.

Figure 4:
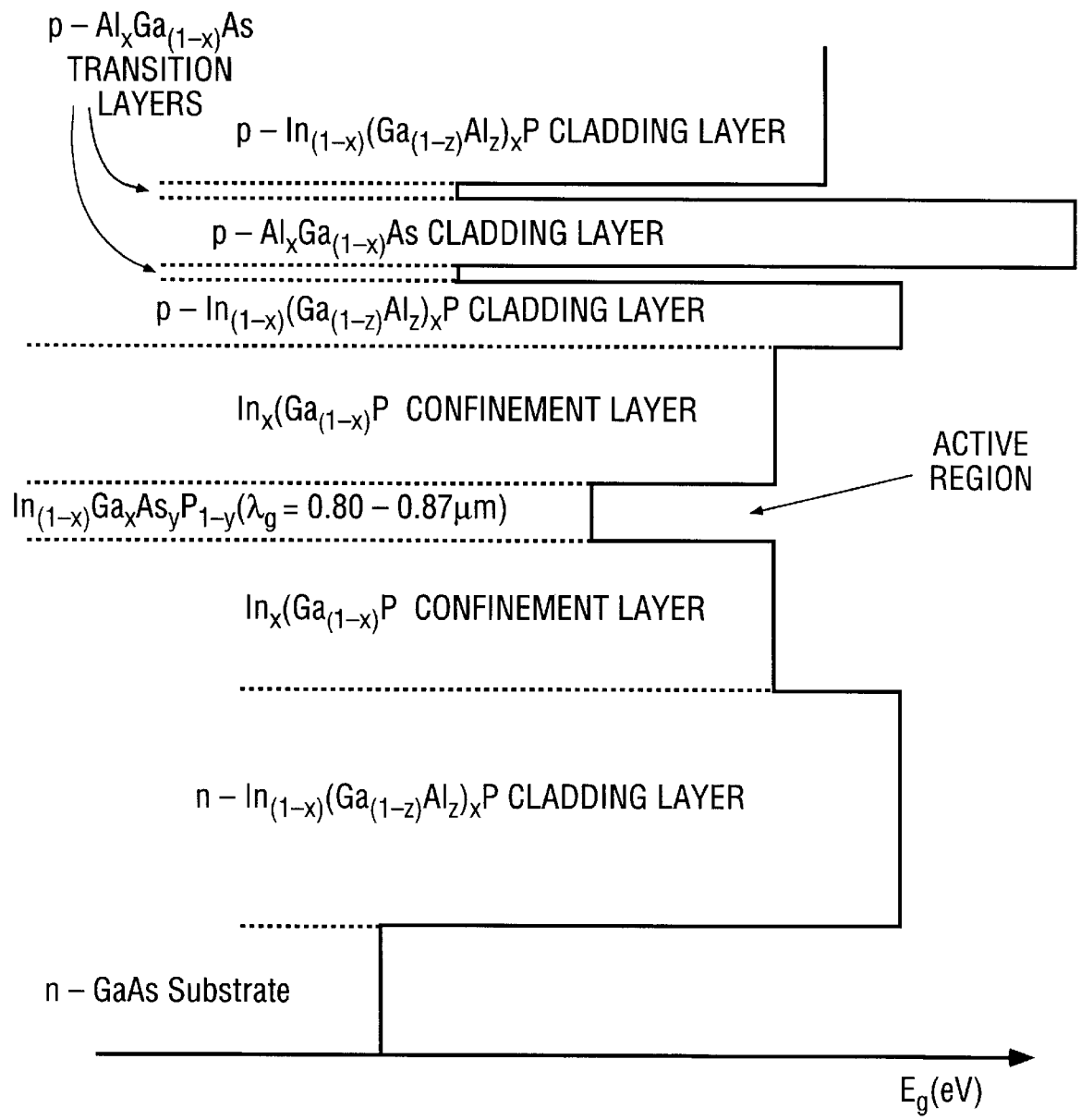
FIG. 4 is a diagram schematically illustrating the semiconductor diode laser structure generally of FIG. 3, but having a p-doped transition layer between each of the p-doped cladding layers.

One example of a diode laser having a basic structure of FIG. 3, but including transition layers is illustrated in FIG. 4. Here, one transition layer is located between first and second upper cladding layers, and another transition layer is located between the second and third upper cladding layers. Preferred composition and thickness ranges of all other layers are the same as for the laser structure of FIG. 3.

One example of a laser having the structure of FIG. 4 had an active layer 150 Å.U. thick; confinement layers having a composition $In_{0.49}Ga_{0.51}P$ and a thickness of 0.4 μm; a lower cladding layer had a composition $In_{0.5}(Ga_{0.5}Al_{0.5})_{0.5}P$ and a thickness of 1.25 μm; a first upper cladding layer had a composition $In_{0.5}(Ga_{0.5}Al_{0.5})_{0.5}P$ and a thickness of 0.1 μm; a second upper cladding layer had a composition $Al_{0.85}Ga_{0.15}As$ and a thickness of 0.1 μm; and a third upper cladding layer had a composition of $In_{0.5}(Ga_{0.9}Al_{0.1})_{0.5}P$ and a thickness of 1.25 μm. Transition layers each had a composition $Al_{0.1}Ga_{0.9}As$ and had a thickness of 50 Å.U.

The laser had a cavity length of 1.5 mm, had uncoated facets, and emitted at λ=0.83 μm. The maximum CW power of the laser was 4.7 W (both facets), and was limited at this value by the onset of catastrophic-optical-mirror-damage (COMD) at an internal power density of 8.7 Megawatts per square centimeter ($MW/cm^2$). By way of comparison, COMD appears in GaAs active layer lasers at an internal power level about 1.7 times less, and in AlGaAs active layer lasers emitting at λ=0.83 μm, at a power level about 2.0 times less. Because of this, it is believed that a diode laser in accordance with present invention can operate reliably at power levels twice as high as prior art diode lasers having an AlGaAs active layer and emitting in the wavelength range 0.80 μm to 0.83 μm.

Other relevant characteristics of a 1.5 mm-long cavity laser having the structure of FIG. 4 were a $J_{th}$=227 A/cm², $\eta_d$=45% and $T_0$=160K. The high $T_0$ is due to the additional AlGaAs cladding layer and its high energy bandgap. This $T_0$ value is believed to be higher than has been reported for any prior art aluminum-free diode laser of the same cavity length. A similar laser emitting at 0.81 μm had $T_0$=176K, which is believed to be higher than reported for any prior art aluminum-free diode laser of any cavity length.

While InGaAlP is one preferred material for a third upper cladding layer in a multiple cladding layer arrangement as discussed above, a laser in accordance with the present invention having such a multiple cladding layer arrangement would also be effective were the third upper cladding layer formed from $Al_yGa_{(1-y)}As$, wherein x was selected such that the third upper cladding layer had an energy bandgap less than the energy bandgap of the second cladding layer (y<x compared with second upper cladding layer). Preferably y in such a third upper cladding layer has a value between about 0.35 and 0.70 and more preferably between about 0.35 and 0.45. These ranges provide that the third upper cladding layer cladding layer has an energy bandgap greater than the energy bandgap of the upper confinement layer, which in turn provides that there is no leakage of radiation from the upper confinement layer of the laser structure.

Figure 5:
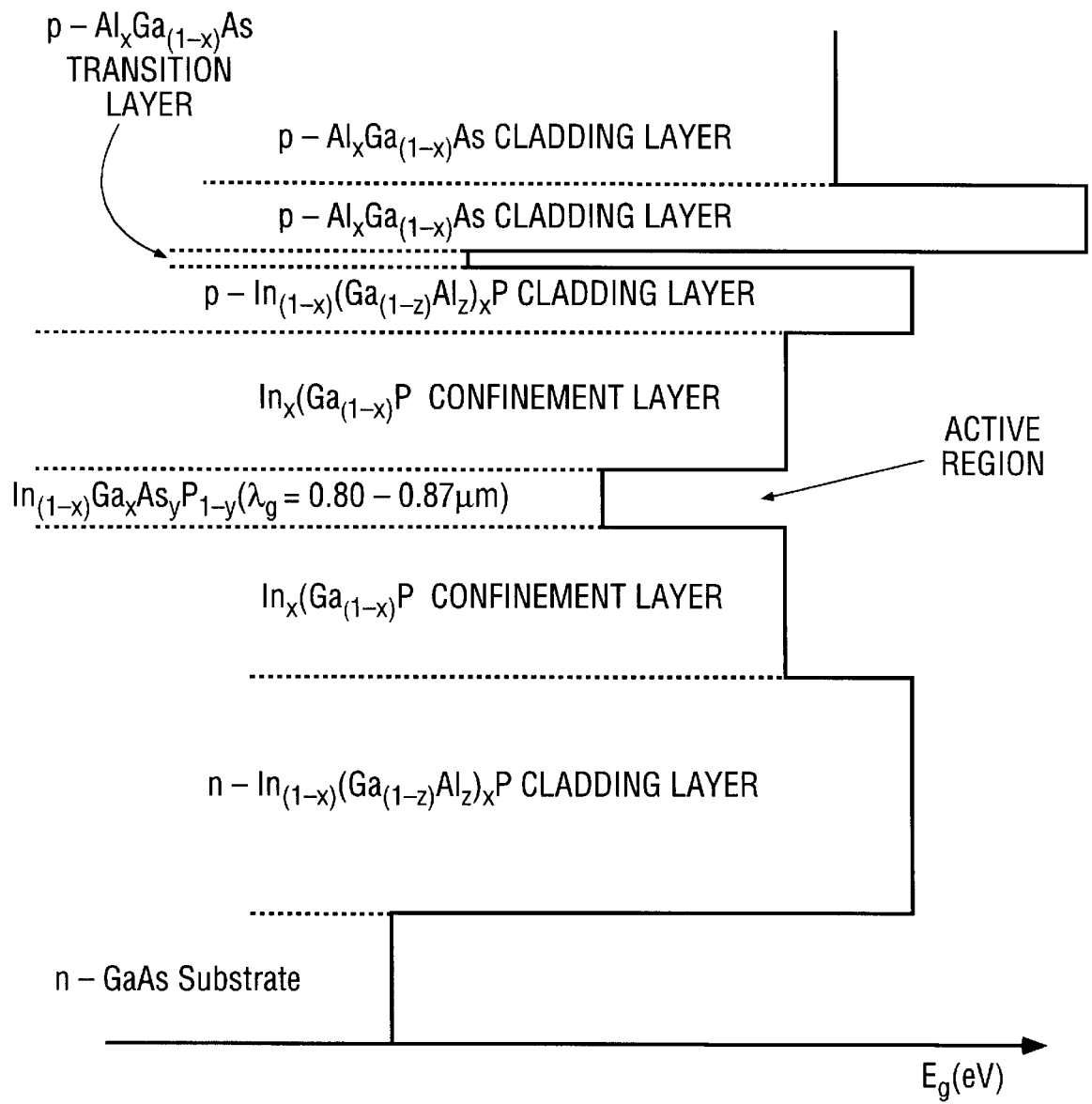
FIG. 5 is a diagram schematically illustrating a third preferred embodiment of a semiconductor diode laser structure in accordance with the present invention having an InGaAsP active layer having a composition selected to provide light emission at a wavelength $\lambda_g$ between about 0.80 μm and 0.87 μm, and one n-doped lower cladding layer, one p-doped InGaAlP cladding layer, and first and second p-doped AlGaAs cladding layers surmounting the p-doped the p-doped InGaAlP cladding layer.

Such a laser structure is illustrated in FIG. 5. The preferred thickness ranges for this third upper cladding layer are the same as for above-discussed third cladding layers of InGaAlP. Preferred composition and thickness ranges of all other layers are the same as for the laser structure of FIG. 4.

An advantage of the laser structure of FIG. 5 is that the structure allows for less material calibration than the structure of FIG. 4, while allowing a direct bandgap material, i.e., $Al_xGa_{(1-x)}As$ wherein x is less than or equal to about 0.45) to be grown. Further, there is no requirement for a transition layer between the second and third cladding layers, as both are from the same alloy system.

Above-discussed examples of aluminum-free lasers in accordance with the present invention have each included active and confinement layers of aluminum-free materials. Continuing now with reference to FIG. 6, an embodiment of an aluminum-free diode laser in accordance with the present invention is illustrated wherein only the active layer is aluminum free. Here, a laser structure similar to the laser structure of FIG. 1 includes an active layer having the same general composition and thickness specifications for cladding layers as the laser structure of FIG. 1, but has aluminum-containing confinement layers having a composition $In_{(1-x)}(Ga_{(1-z)}Al_z)_xP$, wherein the aluminum proportion is less than for the cladding layers. Preferred composition and thickness ranges of all other layers and the preferred thickness range of the confinement layers are the same as for the laser structure of FIG. 1.

The aluminum proportion of the aluminum-containing confinement layers is preferably between about 0.05 and 0.15 and more preferably no greater than about 0.1. The small proportion of aluminum in the confinement layers provides a greater energy band discontinuity between the conduction-band edges of the active and confinement layers than were the aluminum proportion of the confinement layers zero, i.e., $In_{(1-x)}Ga_xP$. It is important, however, that when both confinement and cladding layers have the general formula $In_{(1-x)}(Ga_{(1-z)}Al_z)_xP$, wherein x is finite, which is the case for the laser structure of FIG. 6, x and z for the confinement and cladding layers should be selected such that the cladding layers have a higher energy bandgap than the confinement layers. In other words aluminum proportion of the cladding layers should be higher than the aluminum proportion of the confinement layers. As in other examples discussed herein, upper and lower cladding layers are respectively p and n-doped.

It should be noted that the InGaP confinement layers of the lasers of FIGS. 1, 3, 4, and 5 may be defined as having a general composition $In_{(1-x)}(Ga_{(1-z)}Al_z)_xP$ wherein z is zero. Accordingly this general composition may be used to define the composition of confinement layers in all embodiments of a laser in accordance with the present invention described herein.

Providing confinement layers having a higher energy gap than $In_{0.49}Ga_{0.51}P$ was anticipated to provide improved performance through improved carrier confinement. Accordingly, a laser having the structure of FIG. 6 was grown wherein: the active layer had a thickness of 150 Å.U.; the confinement layers had a composition $In_{0.5}(Ga_{0.9}Al_{0.1})_{0.5}P$ and a thickness of 0.4 μm; the upper and lower cladding layers each had a composition $In_{0.5}(Ga_{0.5}Al_{0.5})_{0.5}P$, and a thickness of 1.25 μm. The laser had a cavity length of 1.0 mm, emitted at λ=0.813 μm, had a value of $T_0$=138K, which indicated that carrier confinement had improved, compared with the above-discussed example of the laser of FIG. 1. This improvement however was obtained at the expense of a significantly higher $J_{th}$ value of 400 A/cm². This relatively high $J_{th}$ value is believed to be due to some problem related to interfaces between the active layer and surrounding confinement layers.

Figure 6:
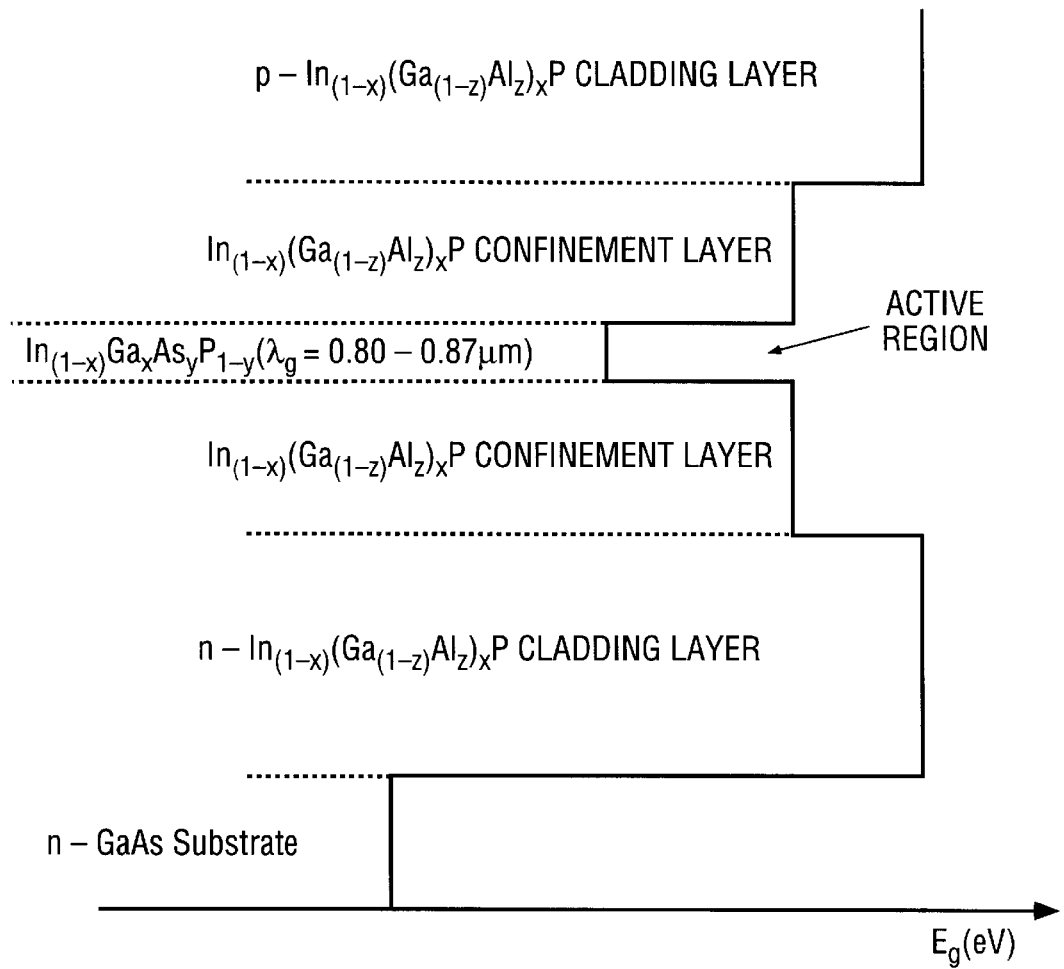
FIG. 6 is a diagram schematically illustrating a fourth preferred embodiment of a semiconductor diode laser structure in accordance with the present invention having an InGaAsP active layer having a composition selected to provide light emission at a wavelength $\lambda_g$ between about 0.80 μm and 0.87 μm, two InGaAlP confinement layers, and one p-doped and one n-doped InGaAlP cladding layers.
Figure 7:
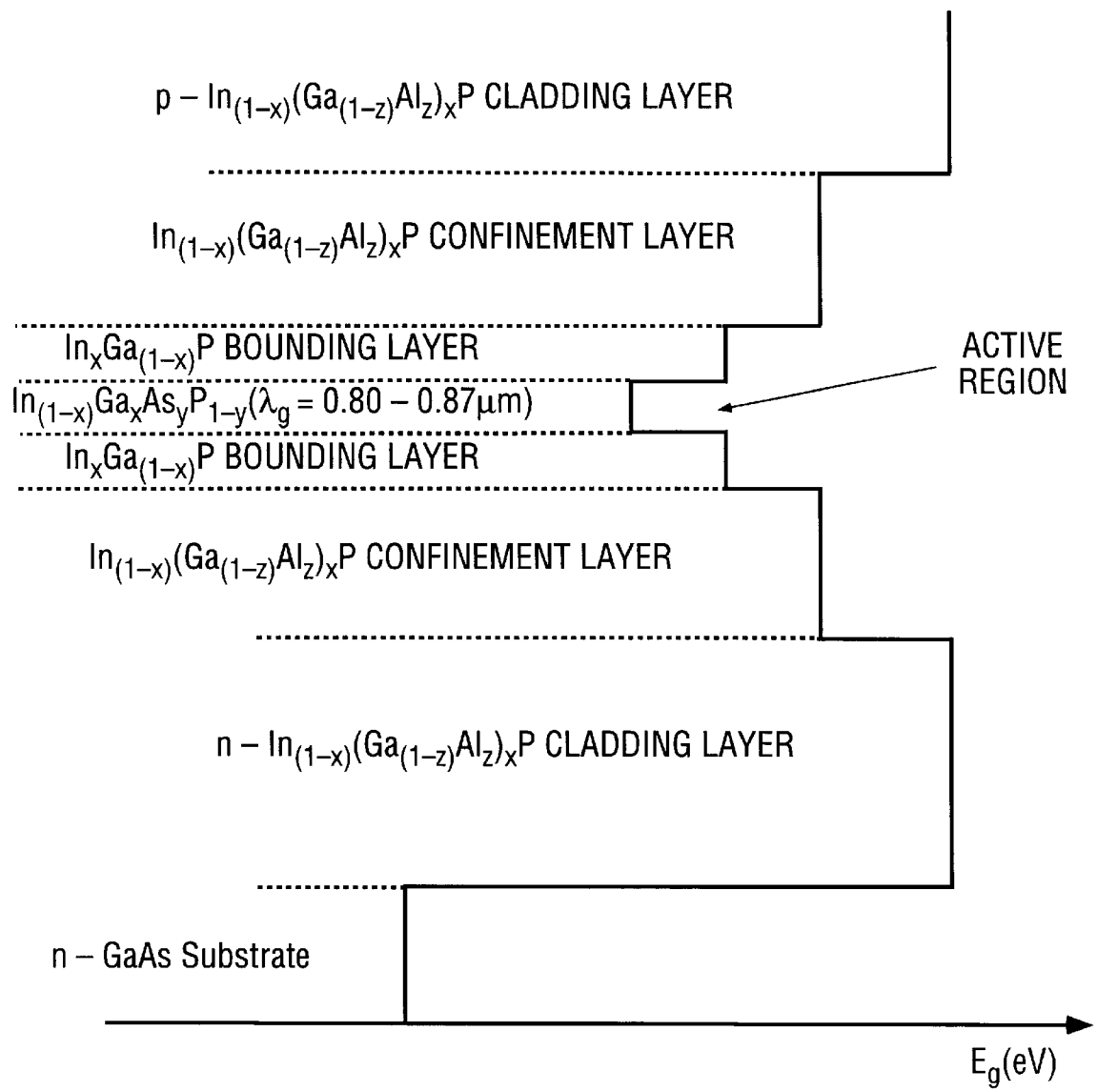
FIG. 7 is a diagram schematically illustrating a fifth preferred embodiment of a semiconductor diode laser structure in accordance with the present invention having an InGaAsP active layer having a composition selected to provide light emission at a wavelength $\lambda_g$ between about 0.80 μm and 0.87 μm, bounded on each side thereof by an InGaP bounding layer, and having two InGaAlP confinement layers, and one p-doped and one n-doped InGaAlP cladding layers.

Referring now to FIG. 7, one means of mitigating this interface problem is described. Here, a diode laser structure similar to the structure of FIG. 6 is illustrated, but wherein a relatively thin layer, having a general composition $In_{(1-x)}Ga_xP$ (where 0<x<1), is located between the active layer and the upper and lower confinement layers. These relatively thin layers may be described as bounding layers for the active layer. A preferred composition for the bounding layers is $In_{0.49}Ga_{0.51}P$ which is latticed matched to the GaAs substrate. Preferred composition and thickness ranges for all other layers are the same as for the laser structure of FIG. 6.

The thickness of the bounding layers is preferably between about 30 Å.U. and 250 Å.U. A thickness of 30 Å.U. is believed to be the minimum thickness required to smooth the transition between the InGaAsP active layer and the InGaAlP confinement layers. If the bounding layers are thicker than about 250 Å.U., absorption of the emitted light may occur, which will have the undesired effect of increasing threshold and lowering overall efficiency.

A laser having the structure of FIG. 7 was grown wherein: the active layer had a thickness of 150 Å.U.; the bounding layers had a composition $In_{0.49}Ga_{0.51}P$ and a thickness of about 200 Å.U.; the confinement layers had a composition $In_{0.5}(Ga_{0.9}Al_{0.1})_{0.5}P$ and a thickness of 0.4 μm; the upper and lower cladding layers each had a composition $In_{0.5}(Ga_{0.5}Al_{0.5})_{0.5}P$, and a thickness of 1.50 μm. The laser had a cavity length of 1.0 mm, emitted at a λ=0.813 μm, and had a $T_0$ value of 140K, and Jth=290 A/cm². The high $T_0$ value indicates that the bounding layers do not adversely affect the carrier retaining properties of the InGaAlP confinement layers. The relative low $J_{th}$ value indicates that the bounding layers are effective in essentially eliminating active layer/confinement layer interface problems of a laser having the structure of FIG. 6.

It should be noted here, that the choice of $In_{0.49}Ga_{0.51}P$ as a material for the above-described bounding layers should not be considered limiting. It is believed that other materials having the general composition $In_{(1-x)}Ga_xP$ (where 0<x<1) may similarly effective. Generally, the active layer and bounding layers should have a net strain of about zero. Because of the this if the composition of the active layer is such that it is strained, the composition of the bounding layers must be selected such that they are oppositely strained. For example, if the active layer is compressively strained, the bounding layers should be tensilely strained. The bounding layers also must have an energy bandgap which is greater than the energy bandgap of the active layer but less than the energy bandgap of the confinement layers.

Figure 8:
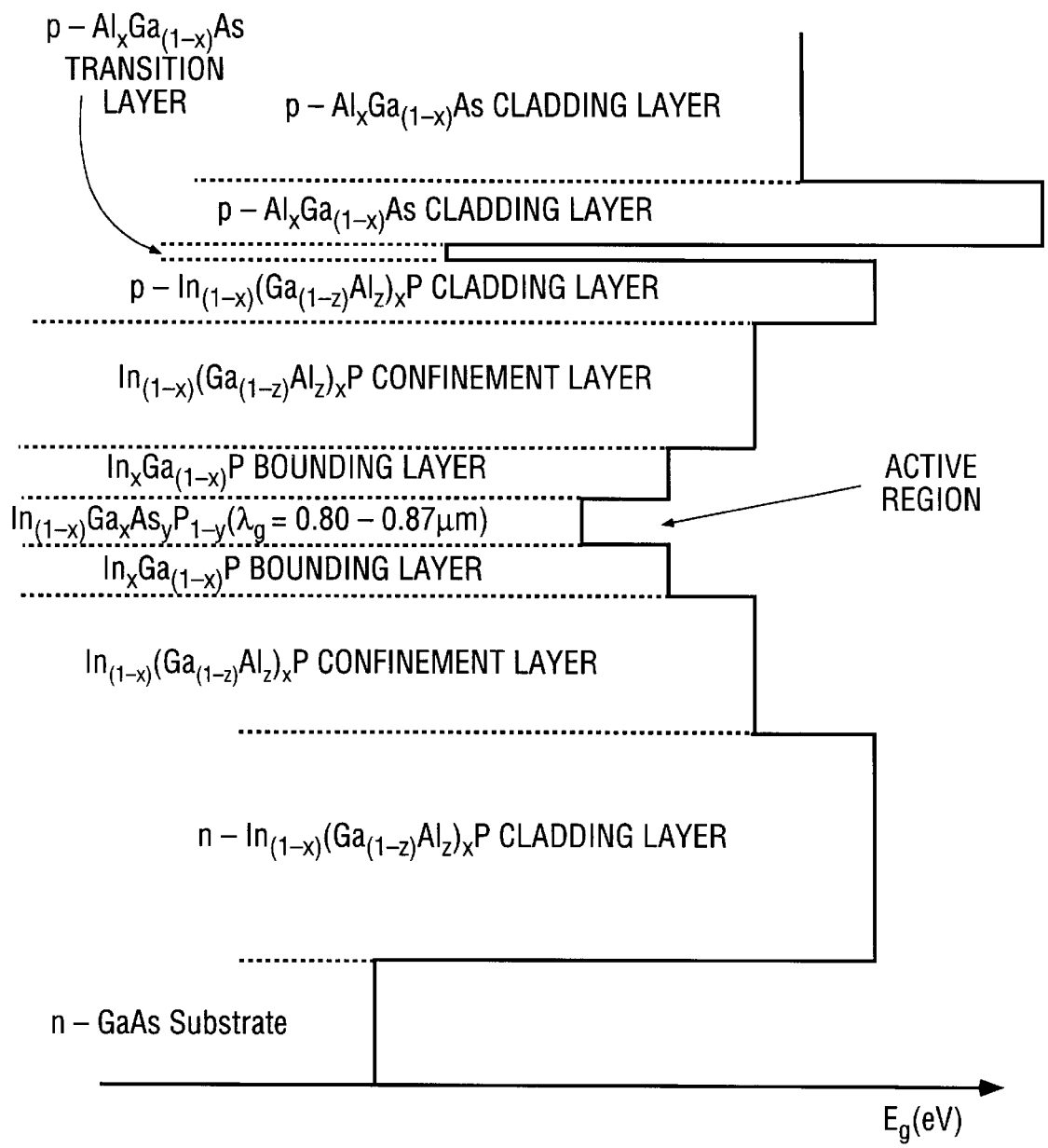
FIG. 8 is a diagram schematically illustrating a sixth preferred embodiment of a semiconductor diode laser structure in accordance with the present invention having the active layer, bounding layer and confinement layer arrangement of FIG. 7, and the multiple p-doped cladding layer arrangement of FIG. 5.

The above-discussed multiple p-doped (upper) cladding layer arrangements of FIGS. 4 and 5 may be advantageously combined with the InGaAlP confinement layer (including InGaP) bounding layer arrangement of FIG. 7 to provide advantages of both. One example such a structure is illustrated in FIG. 8, wherein InGaAlP confinement layers are separated from an InGaAsP active layer by InGaP bounding layers, as in the laser structure of FIG. 7; and a first upper cladding layer is formed from InGaAlP, and second and third upper cladding layers are formed from AlGaAs, as in the laser structure of FIG. 5. A GaAs (here, meaning specifically $Al_xGa_{(1-x)}As$ wherein x is zero) transition layer separates the first and second upper cladding layers as in the laser structure of FIG. 5. Preferred composition and thickness ranges for layers of the laser structure of FIG. 8 are those discussed above for corresponding layers of the laser structures of FIG. 7 and FIG. 5.

Figure 9:
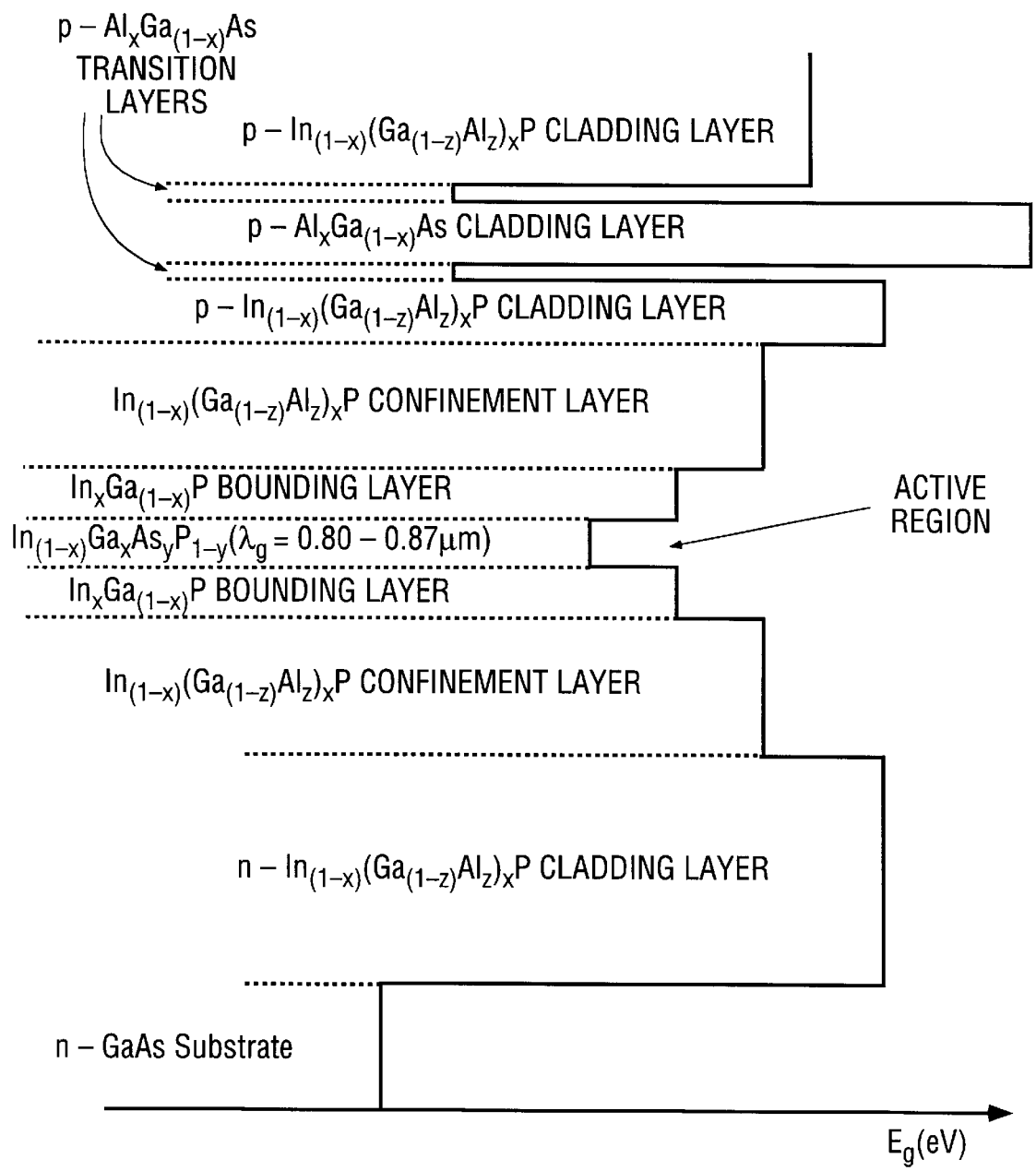
FIG. 9 is a diagram schematically illustrating a seventh preferred embodiment of a semiconductor diode laser structure in accordance with the present invention having the active layer, bounding layer and confinement layer arrangement of FIG. 7, and the multiple p-doped cladding layer arrangement of FIG. 4.

FIG. 9 illustrates a laser structure generally in accordance with the structure of FIG. 8, but wherein multiple upper cladding layers have the composition and arrangement of multiple upper cladding layers of the laser structure of FIG. 4, i.e., first and third upper cladding layers of InGaAlP having a second upper cladding layer of AlGaAS therebetween, with cladding layers separated from each other by AlGaAs transition layers. Preferred composition and thickness ranges for layers of the laser structure of FIG. 9 are those of corresponding layers of the laser structures of FIG. 7 and FIG. 4.

In the lasers having the basic structures of FIG. 8 and FIG. 9 it may be possible to produce working devices without one or both transition layers, for example with upper cladding layers arranged as in the structure of FIG. 3. The performance of such devices however can be expected to be to be inconsistent, at best. Because of this, omitting these transition layers is not recommended.

Figure 10:
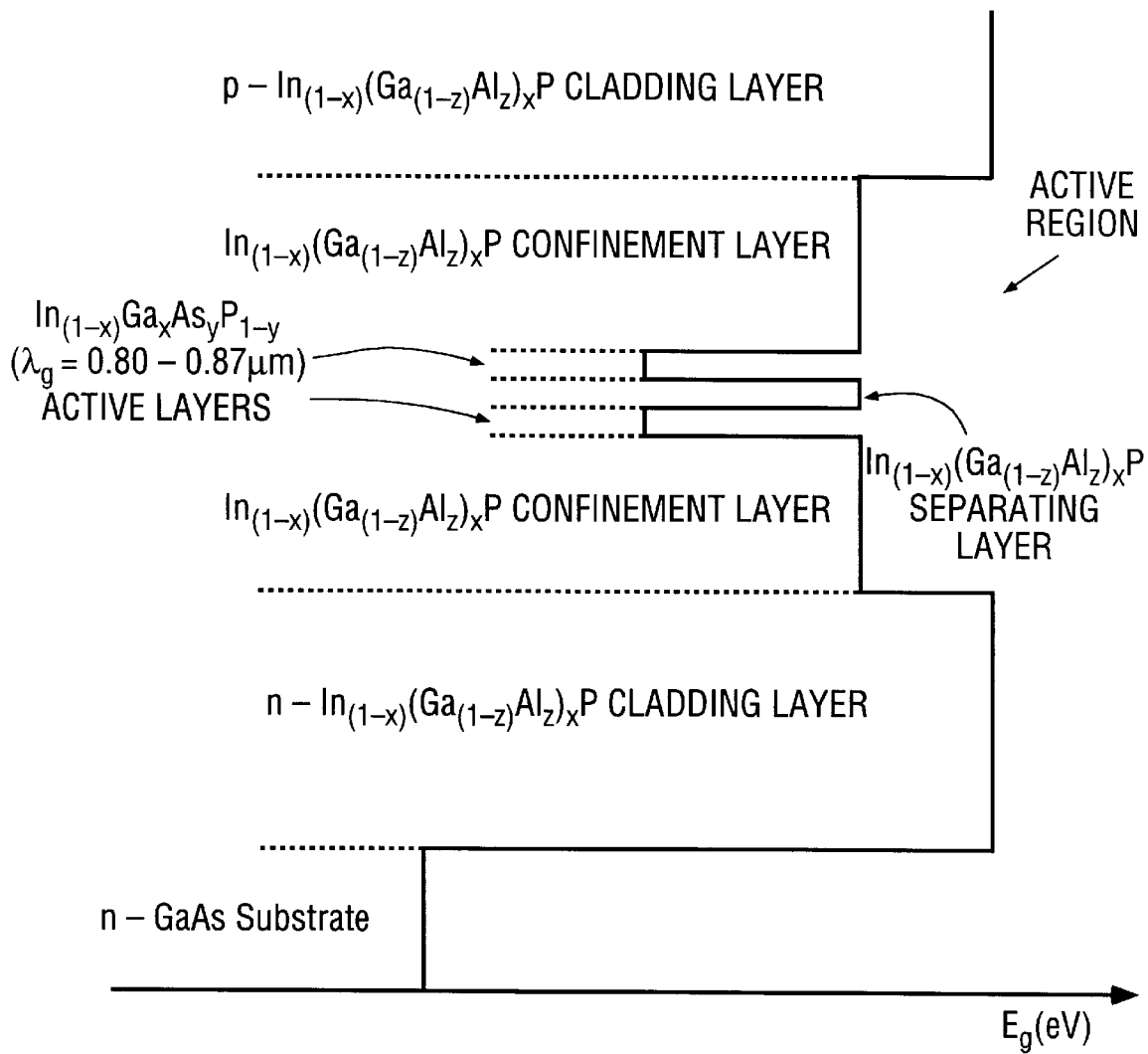
FIG. 10 is diagram schematically illustrating an eighth preferred embodiment of the present invention having an active region including two active layers or quantum-wells spaced apart by a separating-layer, the active region bounded by confinement layers.
Figure 11:
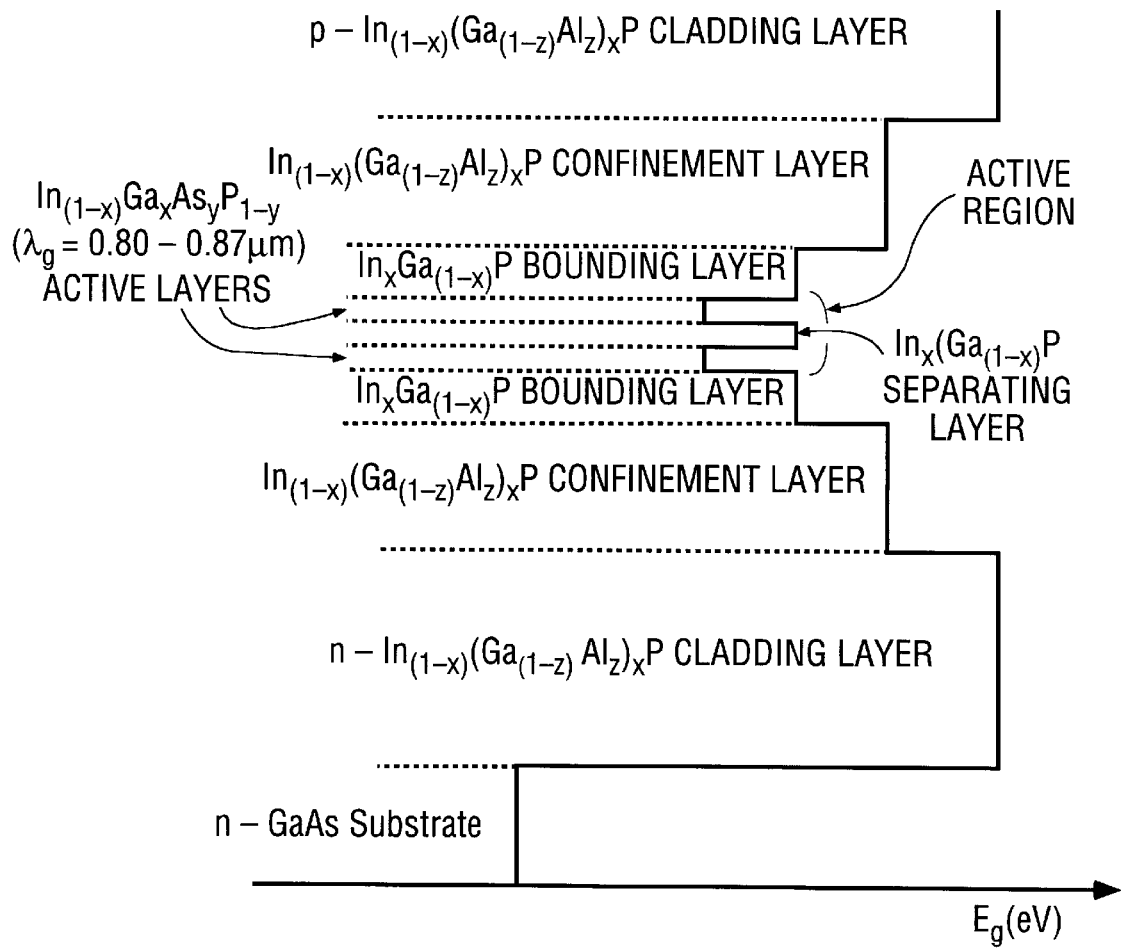
FIG. 11 is diagram schematically illustrating an ninth preferred embodiment of the present invention having an active region including two active layers or quantum-wells spaced apart by a separating-layer, the active region bounded by bounding layers and the bounding layers bounded by confinement layers.

Above-described embodiments of the present invention have been described in terms of laser structures having active regions consisting of ony one active layer, i.e., a single quantum well. Those skilled in the art to which the present invention pertains, will be aware however that a separate confinement heterostructure semiconductor diode laser may have an active region which includes two or more active layers, i.e., multiple quantum wells. By way of example, active region arrangements including two active layers or quantum-wells are illustrated in FIG. 10 and FIG. 11. In FIG. 10 the active region is bounded by confinement layers, as it would be when substituted for the single active layer in the laser structures of FIGS. 1, 3, 4, 5 and 6. In FIG. 11 the active region is bounded by bounding layers as it would be when substituted for the single active layer in the laser structures of FIGS. 7, 8, and 9.

The active layers in these multiple active layer active regions have the same preferred composition ranges as above-discussed single active layers. The multiple active layers are spaced apart by a separating layer which is preferably formed from $In_{(1-x)}(Ga_{(1-z)}Al_z)_xP$ where $0<x<1$, $0\leq z<1$, and x and z are selected to match the composition of the layers immediately adjacent the active region. Whatever the number of active layers in an active region, the total thickness of active layers and separating layers is preferably less than or equal to the greatest preferred thickness specified above for a single active layer.

In summary, a family of aluminum-free semiconductor diode lasers in accordance with the present invention have been described above. These lasers have in common an active region including at least one aluminum-free active-layer having a general composition $In_{(1-x)}Ga_xAs_yP_{(1-y)}$ where $0<x<1$, and $0\leq y\leq 1$, two confinement layers having a general composition $In_{(1-x)}(Ga_{(1-z)}Al_z)_xP$ where $0<x<1$, and $0\leq z<1.0$ wherein aluminum content may be zero, and a lower and at least one upper cladding layer which have the same general composition as the adjacent confinement layer, but wherein the aluminum content is always finite, and is selected relative to the aluminum content of the confinement layer such that the cladding layer has a higher energy bandgap than the cladding layer. Preferably the aluminum ratio (product of x and z) of the lower and at least one upper cladding layers is no greater than about 0.3. This provides that the material of these cladding layers has a direct bandgap.

The present invention has been described and depicted in terms of preferred embodiments. The invention is not limited, however, to those embodiments described and depicted. Rather the invention is limited only by the claims appended hereto.

What is claimed is:

1. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0<y<1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0<z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a p-doped third cladding layer adjacent said second cladding layer and having a composition $Al_xGa_{(1-x)}As$, where $0<x\leq 1$ and x is selected such that said third cladding layer has a conduction band energy offset, with respect to said second confinement layer, greater than that of said second cladding layer;

and a p-doped fourth cladding layer adjacent said third cladding layer and having a composition $In_{(1-r)}(Ga_{(1-m)}Al_m)_rP$ where $0<r<1$, $0<m<1$, and r and m are selected such that said fourth cladding layer has an energy bandgap less than or equal to the energy bandgap of said second cladding layer.

2. A gain-guided, separate confinement heterostructure, diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq 1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In(1-x)(Ga_{(1-z)}Al_z)_xP$ where $0<x<1$, $0z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In(1-q)(Ga_{(1-w)}Al_w)_qP$, where $0<q<1$, $0<w<1.0$, the product of q and w is between about 0.22 and 0.3, and q, w, x and z are selected such that said first and second cladding layers have a greater energy bandgap than said optical confinement layers;

a p-doped third cladding layer adjacent said second cladding layer and having a composition $Al_xGa_{(1-x)}As$, where $0<x\leq 1$ and x is selected such that said third cladding layer has a conduction band energy offset, with respect to said second confinement layer, greater than that of said second cladding layer;

and a p-doped fourth cladding layer adjacent said third cladding layer and having a composition $In_{(1-r)}(Ga_{(1-m)}Al_m)_rP$ where 0.

3. A diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq 1$, and x an y are selected such that the laser has a light emission wavelength between about 0.80 and 0.87 micrometers;

first and second confinement layers, said first confinement layer adjacent said active region on the substrate side thereof and said second confinement layer adjacent said active region on an opposite side thereof, each of said confinement layers having a thickness between about 0.2 and 0.5 micrometers and having a composition $In_{(1-x)}(Ga_{(1-z)}Al_z)_xP$ where $0<x<1$, $0\leq z<1$, and the product of x and z is between about 0.05 and 0.15;

first and second cladding layers adjacent said first and second confinement layers respectively, said first and second cladding layers having a composition $In_{(1-q)}(Ga_{(1-w)}Al_w)_qP$, where $0<q<1$, $0<w<1$ and the product of q and w is between about 0.2 and 0.30, said first and second cladding layers being respectively n and p doped, and said first cladding layer having a thickness between about 1.0 and 1.5 micrometers, and said second cladding layer having a thickness between about 0.1 and 0.2 micrometers;

a first transition layer adjacent said second cladding layer said first transition layer having a thickness less than said second cladding layer and having a composition $Al_xGa_{(1-x)}As$ where x greater than or equal to zero and less than about 0.2; and a third cladding layer adjacent said transition layer, said third cladding layer having a composition $Al_xGa_{(1-x)}As$ where x is between about 0.7 and 1.0, and having a thickness between about 0.1 and 0.3 micrometers.

4. The diode laser structure of claim 3, further including a fourth cladding layer adjacent said third cladding layer said fourth cladding layer having a composition $Al_xGa_{(1-x)}As$ where x is between about 0.35 and 0.7, and having a thickness between about 0.2 and 1.5 micrometers.

5. The diode laser structure of claim 3, further including a second transition layer adjacent said third cladding layer, said second transition layer having a thickness less than said second cladding layer and having a composition $Al_xGa_{(1-x)}As$ where x is greater than or equal to zero and less than about 0.2, and a fourth cladding layer adjacent said second transition layer, said fourth cladding layer having a composition $In_{(1-x)}(Ga_{(1-y)}Al_y)_xP$ where $0<x<1$, $0<y<1$, and the product of x and y is between about 0.05 and 0.30, and x and y are selected such that said fourth cladding layer has an energy bandgap less than or equal to the energy bandgap of said second cladding layer.

6. A diode laser structure formed on an n-type GaAs substrate, the structure comprising:

an active region including at least one undoped active layer of $In_{(1-x)}Ga_xAs_yP_{(1-y)}$ where $0<x<1$, and $0<y\leq1$, and x an y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers having a thickness between about 30 and 250 Ångstrom units, and said bounding layers having a composition $In_{(1-x)}Ga_xP$ where $0<x<1$;

first and second confinement layers, said first and second confinement layers adjacent respectively said first and second bounding layers, each of said confinement layers having a thickness between about 0.2 and 0.5 micrometers and having a composition $In_{(1-x)}(Ga_{(1-z)}Al_z)_xP$ where $0<x<1$, $0<z<1$ and the product of x and z is between about 0.05 and 0.15;

first and second cladding layers adjacent said first and second confinement layers respectively, said first and second cladding layers having a composition $In_{(1-q)}(Ga_{(1-w)}Al_w)_qP$ where $0<q<1$, $0<w<1$, and the product of q and w is between about 0.2 and 0.30, said first and second cladding layers being respectively n and p doped, and said first cladding layer having a thickness between about 1.0 and 1.5 micrometers, and said second cladding layer having a thickness between about 0.1 and 0.2 micrometers;

a first transition layer adjacent said second cladding layer said first transition layer having a thickness less than said second cladding layer and having a composition $Al_xGa_{(1-x)}As$ where x is greater than or equal to zero and less than about 0.2;

a third cladding layer adjacent said transition layer said third cladding layer having a composition $Al_xGa_{(1-x)}As$ where x is between about 0.7 and 1.0, and having a thickness between about 0.1 and 0.3 micrometers; and said bounding layers having an energy bandgap greater than the energy bandgap of said active layer and less than the energy bandgap of said confinement layers.

7. The diode laser structure of claim 6, further including a fourth cladding layer adjacent said third cladding layer said fourth cladding layer having a composition $Al_xGa_{(1-x)}As$ where x is between about 0.35 and 0.7, and having a thickness between about 0.2 and 1.5 micrometers.

8. The diode laser structure of claim 6, further including a second transition layer adjacent said third cladding layer, said second transition layer having a thickness less than said second cladding layer and having a composition $Al_xGa_{(1-x)}As$ where x is greater than or equal to zero and less than about 0.2, and a fourth cladding layer adjacent said second transition layer, said fourth cladding layer having a composition $In_{(1-x)}(Ga_{(1-y)}Al_y)_xP$ where $0<x<1$, $0<y<1$, and the product of x and y is between about 0.05 and 0.30, and x and y are selected such that said fourth cladding layer has an energy bandgap less than or equal to the energy bandgap of said second cladding layer.

9. A diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq1$, and x an y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers having a thickness between about 30 and 250 Ångstrom units, and said bounding layers having a composition $In_{(1-x)}Ga_xP$ where $0<x<1$;

first and second confinement layers, said first and second confinement layers adjacent respectively said first and second bounding layers, each of said confinement layers having a thickness between about 0.2 and 0.5 micrometers and having a composition $In_{(1-x)}(Ga_{(1-z)}Al_z)_xP$ where $0<x<1$, $0<z<1$ and the product of x and z is between about 0.05 and 0.15;

first and second cladding layers adjacent said first and second confinement layers respectively, said first and second cladding layers having a composition $In_{(1-q)}(Ga_{(1-w)}Al_w)_qP$ where $0<q<1$, $0<w<1$, and the product of q and w is between about 0.2 and 0.30, said first and second cladding layers being respectively n and p doped, and said first cladding layer having a thickness between about 1.0 and 1.5 micrometers, and said second cladding layer having a thickness between about 0.1 and 0.2 micrometers;

a transition layer adjacent said second cladding layer said first transition layer having a thickness less than said second cladding layer and having a composition $Al_xGa_{(1-x)}As$ where x greater than or equal to zero and less than about 0.2;

a third cladding layer adjacent said transition layer said third cladding layer having a composition $Al_xGa_{(1-x)}As$ where x is between about 0.7 and 1.0, and having a thickness between about 0.1 and 0.3 micrometers;

a fourth cladding layer adjacent said third cladding layer said fourth cladding layer having a composition $Al_xGa_{(1-x)}As$ where x is between about 0.35 and 0.7, and having a thickness between about 0.2 and 1.5 micrometers; and said bounding layers having an energy bandgap greater than the energy bandgap of said active layer and less than the energy bandgap of said confinement layers.

10. A diode laser structure formed on an n-type GaAs substrate, the structure comprising:

an active region including at least one undoped active layer of $In_{(1-x)}Ga_xAs_yP_{(1-y)}$ where $0<x<1$, and $0 \leq y \leq 1$, and x an y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers having a thickness between about 30 and 250 Ångstrom units, and said bounding layers having a composition $In_{(1-x)}Ga_xP$ where $0<x<1$;

first and second confinement layers, said first and second confinement layers adjacent respectively said first and second bounding layers, each of said confinement layers having a thickness between about 0.2 and 0.5 micrometers and having a composition $In_{(1-x)}(Ga_{(1-z)}Al_z)_xP$ where $0<x<1$, $0 \leq z<1$ and the product of x and z is between about 0.05 and 0.15;

first and second cladding layers adjacent said first and second confinement layers respectively, said first and second cladding layers having a composition $In_{(1-q)}(Ga_{(1-w)}Al_w)_qP$, where $0<q<1$, $0<w<1$, and the product of q and w is between about 0.2 and 0.30, said first and second cladding layers being respectively n and p doped, and said first cladding layer having a thickness between about 1.0 and 1.5 micrometers, and said second cladding layer having a thickness between about 0.1 and 0.2 micrometers;

a first transition layer adjacent said second cladding layer said first transition layer having a thickness less than said second cladding layer and having a composition $Al_xGa_{(1-x)}As$ where x greater than or equal to zero and less than about 0.2;

a third cladding layer adjacent said transition layer said third cladding layer having a composition $Al_xGa_{(1-x)}As$ where x is between about 0.7 and 1.0, and having a thickness between about 0.1 and 0.3 micrometers;

a second transition layer adjacent said third cladding layer, said second transition layer having a thickness less than said second cladding layer and having a composition $Al_xGa_{(1-x)}As$ where x is greater than or equal to zero and less than about 0.2;

a fourth cladding layer adjacent said second transition layer, said fourth cladding layer having a composition $In_{(1-x)}(Ga_{(1-y)}Al_y)_xP$ where $0<x<1$, $0<y<1$, and the product of x and y is between about 0.05 and 0.30, and x and y are selected such that said fourth cladding layer has an energy bandgap less than or equal to the energy bandgap of said second cladding layer; and said bounding layers having an energy bandgap greater than the energy bandgap of said active layer and less than the energy bandgap of said confinement layers.

11. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0 \leq y \leq 1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0 \leq z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a p-doped third cladding layer adjacent said second cladding layer and having a composition $Al_xGa_{(1-x)}As$ where $0<x \leq 1$ and x is selected such that said third cladding layer has a conduction band energy offset, with respect to said second confinement layer, greater than that of said second cladding layer;

a transition layer adjacent said third cladding layer, said transition layer having a composition $Al_sGa_{(1-s)}As$, where $0 \leq s<0.2$, and having thickness less than said third cladding layer;

and a fourth cladding layer adjacent said transition layer and having a composition $In_{(1-r)}(Ga_{(1-m)}Al_m)_rP$ where $0<r<1$, and $0<m<1.0$, and r and m are selected are selected such that said fourth cladding layer has an energy bandgap less than or equal to the energy bandgap of said second cladding layer.

12. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0 \leq y \leq 1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0 \leq z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a p-doped third cladding layer adjacent said first transition layer and having a composition $Al_xGa_{(1-x)}As$ where $0<x\leq1$ and x is selected such that said third cladding layer has a conduction band energy offset, with respect to said second confinement layer, greater than that of said second cladding layer;

a second transition layer adjacent said third cladding layer; and a fourth cladding layer adjacent said second transition layer and having a composition $In_{(1-r)}(Ga_{(1-m)}Al_m)_rP$ where $0<r<1$, $0<m<1$, and r and m are selected are selected such that said fourth cladding layer has an energy bandgap less than or equal to the energy bandgap of said second cladding layer;

and wherein said first and second transition layers each have a composition $Al_sGa_{(1-s)}As$ where $0\leq s<0.2$ and have a thickness less than any of said cladding layers.

13. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0\leq z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a transition layer adjacent said second cladding layer;

a p-doped third cladding layer adjacent said transition layer and having a composition $Al_xGa_{(1-x)}As$ where $0<x\leq1$ and x is selected such that said third cladding layer has a conduction band energy offset, with respect to said second confinement layer, greater than that of said second cladding layer;

a fourth cladding layer adjacent said third cladding layer and a composition $In_{(1-r)}(Ga_{(1-m)}Al_m)_rP$ where $0<r<1$, $0<m<1$, and r and m are selected such that said fourth cladding layer has an energy bandgap less than or equal to the energy bandgap of said second cladding layer;

and said transition layer has a composition $Al_sGa_{(1-s)}As$ where $0\leq s<0.2$ and a thickness less than any of said cladding layers.

14. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0\leq z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a p-doped third cladding layer adjacent said second cladding layer, and a p-doped fourth cladding layer adjacent said third cladding layer, said third and fourth cladding layers having respective compositions $Al_xGa_{(1-x)}As$, where $0<x\leq1$, and $Al_yGa_{(1-y)}As$ where $0<y<x$;

and wherein x is selected such that said third cladding layer has a conduction band energy offset, with respect to said second confinement layer, greater than that of said second cladding layer, and y is selected such that said fourth cladding layer has an energy bandgap greater than the energy bandgap of said second confinement layer.

15. A gain-guided separate confinement heterostructure diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq1$, and x and y are selected such that the laser has a light emission wavelength between about 0.80 and 0.87 micrometers;

first and second undoped, optical confinement layers, said first optical confinement layer adjacent said active region on the substrate side thereof and said second optical confinement layer adjacent said active region on the opposite side thereof, each of said optical confinement layers having a composition $In_{(1-x)}(Ga_{(1-z)}Al_z)_xP$ where $0<x<1$, and $0\leq z<1$;

at least first and second cladding layers adjacent said first and second optical confinement layers respectively, said first and second cladding layers having a composition $In_{(1-q)}(Ga_{(1-w)}Al_w)_qP$, where $0<q<1$, and $0<w<1$, the product of q and w being between about 0.22 and 0.30, and said first and second cladding layers being respectively n and p doped;

wherein q, w, x and z for said optical confinement layers and said cladding layers are selected such that said cladding layers have a greater energy bandgap than the energy bandgap of said optical confinement layers;

a transition layer adjacent said second cladding layer, a p-doped third cladding layer adjacent said second cladding layer, and a p-doped fourth cladding layer adjacent said third cladding layer, said third and fourth cladding layers having respective compositions $Al_xGa_{(1-x)}As$, where $0<x\leq 1$, and $Al_yGa_{(1-y)}As$ where $0<y<x$, and wherein x is selected such that said third cladding layer has a conduction band energy offset, with respect to said second confinement layer, greater than that of said second cladding layer, and y is selected such that said fourth cladding layer has an energy bandgap greater than the energy bandgap of said second confinement layer; and said transition layer having a composition $Al_sGa_{(1-s)}As$ where $0\leq s<0.2$, and having a thickness less than any of said cladding layers.

16. A gain-guided, separate confinement heterostructure, diode laser structure formed on an n-type GaAs substrate, the structure comprising:

an active region including at least one undoped active layer of $In_{(1-x)Ga x}As_yP_{(1-y)}$ where $0<x<1$, and $0\leq y\leq 1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In_{(1-x)}(Ga_{(1-z)}Al_z)_xP$ where $0<x<1$, $0<z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In_{(1-q)}(Ga_{(1-w)}Al_w)_qP$, where $0<q<1$, $0<w<1.0$, the product of q and w is between about 0.22 and 0.3, and q, w, x and z are selected such that said first and second cladding layers have a greater energy bandgap than said optical confinement layers;

a p-doped third cladding layer adjacent said second cladding layer and having a composition $Al_xGa_{(1-x)}As$ where $0<x\leq 1$ and x is selected such that said third cladding layer has a conduction band energy offset, with respect to said second confinement layer, greater than that of said second cladding layer;

a transition layer adjacent said third cladding layer, said transition layer having a composition $Al_sGa_{(1-s)}As$, where $0\leq s<0.2$, and having thickness less than said third cladding layer; and a fourth cladding layer adjacent said transition layer and having a composition $In_{(1-r)}(Ga_{(1-m)}Al_m)_rP$ where $0<r<1$, and $0<m<1$, and r, m are selected are selected such that said fourth cladding layer has an energy bandgap less than or equal to the energy bandgap of said second cladding layer.

17. A gain-guided, separate confinement heterostructure, diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq 1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In_{(1-x)}(Ga_{(1-z)}Al_z)_xP$ where $0<x<1$, $0<z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In_{(1-q)}(Ga_{(1-w)}Al_w)_qP$, where $0<q<1$, $0<w<1.0$, the product of q and w is between about 0.22 and 0.3, and q, w, x and z are selected such that said first and second cladding layers have a greater energy bandgap than said optical confinement layers;

a first transition layer adjacent said second cladding layer; a p-doped third cladding layer adjacent said first transition layer and having a composition $Al_xGa_{(1-x)}As$ where $0<x\leq 1.0$ and x is selected such that said third cladding layer has a conduction band energy offset, with respect to said second confinement layer, greater than that of said second cladding layer;

a second transition layer adjacent said third cladding layer;

a fourth cladding layer adjacent said second transition layer and having a composition $In_{(1-r)}(Ga_{(1-m)}Al_m)_rP$ where $0<r<1$, $0<m<1$, and r and m are selected are selected such that said fourth cladding layer has an energy bandgap less than or equal to the energy bandgap of said second cladding layer; and wherein said first and second transition layers each have a composition $Al_sGa_{(1-s)}As$ where $0\leq s<0.2$ and have a thickness less than any of said cladding layers.

18. A gain-guided, separate confinement heterostructure, diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq 1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In_{(1-x)}(Ga_{(1-z)}Al_z)_xP$ where $0<x<1$, $0<z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In_{(1-q)}(Ga_{(1-w)}Al_w)_qP$, where $0<q<1$, $0<w<1.0$, the product of q and w is between about 0.22 and 0.3, and q, w, x and z are selected such that said first and second cladding layers have a greater energy bandgap than said optical confinement layers;

a transition layer adjacent said second cladding layer;

a p-doped third cladding layer adjacent said transition layer and having a composition $Al_xGa_{(1-x)}As$ where $0<x\leq1$ and x is selected such that said third cladding layer has a conduction band energy offset, with respect to said second confinement layer, greater than that of said second cladding layer;

a fourth cladding layer adjacent said third cladding layer and a composition $In_{(1-r)}(Ga_{(1-m)}Al_m)_rP$ where $0<r<1$, $0<m<1$, and r and m are selected such that said fourth cladding layer has an energy bandgap less than or equal to the energy bandgap of said second cladding layer; and wherein said transition layer has a composition $Al_sGa_{(1-s)}As$ where $0\leq s<0.2$ and a thickness less than any of said cladding layers.

19. A gain-guided, separate confinement heterostructure, diode laser structure formed on an n-type GaAs substrate, the structure comprising:

an active region including at least one undoped active layer of $In_{(1-x)}Ga_xAs_yP_{(1-y)}$ where $0.1<x<1$, and $0\leq y\leq1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In_{(1-x)}(Ga_{(1-z)}Al_z)_xP$ where $0<x<1$, $0<z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In_{(1-q)}(Ga_{(1-w)}Al_w)_qP$, where $0<q<1$, $0<w<1.0$, the product of q and w is between about 0.22 and 0.3, and q, w, x and z are selected such that said first and second cladding layers have a greater energy bandgap than said optical confinement layers;

a p-doped third cladding layer adjacent said second cladding layer, and a p-doped fourth cladding layer adjacent said third cladding layer, said third and fourth cladding layers having respective compositions $Al_xGa_{(1-x)}As$, where $0<x\leq1$, and $Al_yGa_{(1-y)}As$ where $0<y<x$; and wherein x is selected such that said third cladding layer has a conduction band energy offset, with respect to said second confinement layer, greater than that of said second cladding layer, and y is selected such that said fourth cladding layer has an energy bandgap greater than the energy bandgap of said second confinement layer.

20. A gain-guided, separate confinement heterostructure, diode laser structure formed on an n-type GaAs substrate, the structure comprising:

an active region including at least one undoped active layer of $In_{(1-x)}Ga_xAs_yP_{(1-y)}$ where $0<x<1$, and $0\leq y\leq1$, and x and y are selected such that the laser has a light emission wavelength between about 0.80 and 0.87 micrometers;

first and second bounding layers, said first bounding layer adjacent said active region on the substrate side thereof and said second bounding layer adjacent said active region on the opposite side thereof, said first and second bounding layers each having a thickness between about 30 and 250 Ångstrom units, and said bounding layers having a composition $In_{(1-x)}Ga_xP$ where $0<x<1$, and x is selected such that said bounding layers have an energy bandgap greater than the energy bandgap of said active layer;

first and second undoped, optical confinement layers, said first optical confinement layer adjacent said first bounding layer and said second optical confinement layer adjacent said second bounding layer, each of said optical confinement layers having a composition $In_{(1-x)}(Ga_{(1-z)}Al_z)_xP$ where $0<x<1$, $0<z<1.0$, and x and z are selected such that said optical confinement layers have an energy bandgap greater than the energy bandgap of said bounding layers;

at least first and second cladding layers adjacent said first and second optical confinement layers respectively, said first and second cladding layers being respectively n and p doped and having a composition $In_{(1-w)}(Ga_{(1-q)}Al_w)_qP$ where $0<q<1$, $0<w<1.0$, the product of q and w is between about 0.22 and 0.3, and q, w, x and z are selected such that said first and second cladding layers have a greater energy bandgap than said optical confinement layers;

a transition layer adjacent said second cladding layer, a p-doped third cladding layer adjacent said second cladding layer, and a p-doped fourth cladding layer adjacent said third cladding layer, said third and fourth cladding layers having respective compositions $Al_xGa_{(1-x)}As$, where $0<x\leq1$, and $Al_yGa_{(1-y)}As$ where $0<y<x$, and wherein x is selected such that said third cladding layer has a conduction band energy offset, with respect to said second confinement layer, greater than that of said second cladding layer, and y is selected such that said fourth cladding layer has an energy bandgap greater than the energy bandgap of said second confinement layer; and said transition layer having a composition $Al_sGa_{(1-s)}As$ where $0 \leq s < 0.2$, and having a thickness less than any of said cladding layers.

* * * * *